(12) United States Patent
Tajiri et al.

(10) Patent No.: US 7,668,001 B2
(45) Date of Patent: Feb. 23, 2010

(54) SEMICONDUCTOR MEMORY DEVICE

(75) Inventors: Masayuki Tajiri, Fukuyama (JP);
Atsushi Shimaoka, Kashihara (JP);
Kohji Inoue, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 242 days.

(21) Appl. No.: 11/921,755

(22) PCT Filed: Jan. 5, 2006

(86) PCT No.: PCT/JP2006/309086

§ 371 (c)(1),
(2), (4) Date: Dec. 7, 2007

(87) PCT Pub. No.: WO2006/134732

PCT Pub. Date: Dec. 21, 2006

(65) Prior Publication Data

US 2009/0135641 A1 May 28, 2009

(30) Foreign Application Priority Data

Jun. 17, 2005 (JP) ............................. 2005-178395
Sep. 28, 2005 (JP) ............................. 2005-282199

(51) Int. Cl.
*G11C 11/00* (2006.01)
(52) U.S. Cl. ....................................... 365/148; 365/226
(58) Field of Classification Search .................. 365/148, 365/226
See application file for complete search history.

(56) References Cited

U.S. PATENT DOCUMENTS

| 6,204,139 | B1 | 3/2001 | Liu et al. | |
|---|---|---|---|---|
| 6,473,332 | B1 * | 10/2002 | Ignatiev et al. | ............... 365/148 |
| 2003/0219534 | A1 | 11/2003 | Zhuang et al. | |
| 2004/0257864 | A1 | 12/2004 | Tamai et al. | |
| 2005/0169093 | A1 | 8/2005 | Choi et al. | |
| 2006/0002174 | A1 * | 1/2006 | Hosoi et al. | ................. 365/148 |
| 2006/0067106 | A1 | 3/2006 | Mori et al. | |

OTHER PUBLICATIONS

International Search Report for PCT/JP2006/309086 mailed Aug. 22, 2006.

* cited by examiner

*Primary Examiner*—Vu A Le
(74) *Attorney, Agent, or Firm*—Nixon & Vanderhye, P.C.

(57) ABSTRACT

A semiconductor memory device (1) comprises a memory cell array (100) in which memory cells each have a variable resistance element and the memory cells in the same row are connected to a common word line and the memory cells in the same column are connected to a common bit line, wherein during a predetermined memory action, the voltage amplitude of the voltage pulse applied to an end of at least one of the selected word line and the selected bit line is adjusted based on the position of the selected memory cell in the memory cell array (100) so that the effective voltage amplitude of a voltage pulse applied to the variable resistance element of the selected memory cell to be programmed or erased falls within a certain range regardless of the position in the memory cell array (100).

17 Claims, 20 Drawing Sheets

US 7,668,001 B2

SEMICONDUCTOR MEMORY DEVICE

CROSS-REFERENCE TO RELATED APPLICATIONS

This application is a National Phase filing under 35 U.S.C. § 371 of International Application No. PCT/JP2006/309086 filed on May 1, 2006, and which claims priority to Japanese Patent Application No. 2005-178395 filed on Jun. 17, 2005 and Japanese Patent Application No. 2005-282199 filed on Sep. 28, 2005.

TECHNICAL FIELD

The present invention relates to a semiconductor memory device and more particularly, to a nonvolatile semiconductor memory device using a nonvolatile variable resistance element.

BACKGROUND ART

Research and development on various kinds of nonvolatile memory (nonvolatile semiconductor memory device) have been promoted recently, and among them, an MRAM (Magneto-resistance Random Access Memory), OUM (Ovonic Universal memory), a PRAM (Phase-change Random Access Memory) and an RRAM (Resistance Random Access Memory) that read a difference in resistance value as data have the advantages that there is no statistical physical limit regarding scaling.

In general, the PRAM and the RRAM are provided with a nonvolatile variable resistance element whose resistance value is changed when a voltage pulse having a certain threshold value or more is applied, and include a memory cell array having memory cells each including a variable resistance element without a selection element such as a transistor and a diode. Here, FIG. 2 is a schematic view showing one constitution example of the memory cell array. A memory cell array 100 is constituted such that memory cells each having a variable resistance element 103 are arranged in a row direction and a column direction, one end of each of the variable resistance elements 103 arranged in the same row is connected to a word line 102, and one end of each of the variable resistance elements 103 arranged in the same column is connected to a bit line 101. A resistance value of the variable resistance element 103 is changed when the potential difference between the bit line 101 and the word line 102 becomes higher than a certain threshold value $V_{TH}$.

FIG. 13 shows one example of a memory cell array 200 including no selection element. The memory cell array 200 is a cross point type memory in which a variable resistor 202 and an upper electrode 203 that intersect with a lower electrode 201 at right angles are laminated on the lower electrode 201. Since the selection element is not used, an area occupied by a memory cell can be small, so that the memory has large capacity. Furthermore, since such cross point type memory is simple in structure, a multilayer structure can be easily provided and a high-integrated memory can be implemented.
Patent document 1: U.S. Pat. No. 6,204,139B1
Patent document 2: Japanese Laid-Open Patent Publication No. 2003-338607

DISCLOSURE OF THE INVENTION

Problems to be Solved by the Invention

Characteristics of a variable resistance element in a memory cell are largely changed by an applied voltage. According to the above RRAM, as an effective voltage applied to the variable resistance element is increased, the change in resistance value is increased, so that resistance change speed (pulse response) is also improved.

Here, according to the memory cell array shown in FIG. 2, since a wiring length from a power supply and the like to each memory cell is different depending on the position of the memory cell in the memory cell array, wiring resistance differs. Therefore, in a programming action and an erasing action (reset action), since the value of a voltage pulse applied to the variable resistance element is different between the memory cells, it is likely that there is a variation in resistance change of each variable resistance element. Especially, as shown in FIG. 13, when there is no selection element, a ratio occupied by the wiring resistance is large, so that the difference in wiring resistance due to the difference in wiring length greatly affects the resistance change. Furthermore, since the dissolved state is provided in the PRAM and the RRAM in the programming action and the like, a resistance value of the variable resistance element is reduced to several tens to several hundred Ω that is the same order as the wiring resistance, so that the difference in wiring resistance greatly affects the resistance change.

FIG. 14 shows a schematic constitution of the cross point type memory. A variable resistance element exists at an intersection of each of bit lines B0 to B7 and each of word lines W0 to W7 to form a memory cell. Here, when it is assumed that a resistance value of the variable resistance element in the memory cell is R, and a total of resistance values of wiring resistance from ends of a selected word line and a selected bit line to a selected memory cell is $R_{LINE}$, an effective voltage $V_R$ applied to the variable resistance element in a voltage $V_{BW}$ applied to the bit line and the word line is expressed by the following formula 1.

$$V_R = R/(R+R_{LINE}) \times V_{BW} \qquad \text{Formula 1}$$

Here, when it is assumed that a wiring length is L and resistance values per unit length of wiring of both bit line and word line is ρ for simplification, $R_{LINE}=\rho$ L is provided. Thus, the wiring length L is such that L=(bit line)+(word line)=($l_a$+$l_b$)+($2l_a$+$l_b$)=$3l_a$+$2l_b$ at "A" point in FIG. 14 and L=($6l_a$+$l_b$)+($4l_a$+$l_b$)=$10l_a$+$2l_b$ at "B" point. Therefore, it is clearly understood that the effective voltage applied to the variable resistance element is low at the "B" point having a longer wiring. In addition, when it is assumed that ρ=0.6 Ω/μm, $l_a$=1.5 μm, $l_b$=15 μm, power supply voltage $V_{DD}$=4V, and R=100Ω in FIG. 14, the effective voltage $V_{RA}$ applied to the variable resistance element at the "A" point is 3.31V and the effective voltage $V_{RB}$ at the "B" point is 3.15V according to the formula 1.

The difference in effective voltage applied to the variable resistance element greatly affects resistance change speed (pulse response) especially. FIG. 15 is a graph showing a relation between the resistance value of the variable resistance element and a pulse width of an applied voltage pulse. It can be seen from the graph that there is a peak in the resistance value of the variable resistance element and the applied voltage pulse has an optimal pulse width that can maximize the resistance change. As the pulse width becomes short, the resistance change of the variable resistance element becomes fast, and it is considered that the pulse response as the element is fast.

FIG. 16 is a graph showing a relation between the pulse width of the applied voltage when the resistance value of the variable resistance element reaches a peak and the effective voltage applied to the variable resistance element. It can be seen from FIG. 16 that when the effective voltage $V_{RA}$=3.31V at the "A" point and the effective voltage $V_{RB}$=3.15V at the "B" point, the pulse widths when the resistance values reach the peaks are 154 ns and 253 nm, respectively. Thus, it can be understood that even slight difference in voltage greatly affects the pulse response.

The memory cell array shown in FIG. 14 is small in size because it is for explanation, so that the difference in effective voltage applied to the variable resistance element due to the difference in wiring length is relatively small. However, in a case of a general 16 K-bit memory cell array, when the formula 1 is calculated using the above parameters, the effective voltage is 3.34V at the maximum and 1.15V at the minimum. As a result, the pulse widths of the applied voltage pulse when the resistance values of the variable resistance elements reach the peak are 144 ns and 4.46 ms, respectively, which results in a difference of thirty thousand times or more.

The present invention was made in view of the above problem and it is an object of the present invention to provide a semiconductor memory device in which the variation in effective voltage applied to the variable resistance element due to the difference in wiring length caused by the difference in position in the memory cell array is corrected to prevent resistance change characteristics of the variable resistance element from being varied among the memory cells.

Means for Solving the Problems

A semiconductor memory device according to the present invention to attain the above object includes a memory cell array provided with memory cells having a variable resistance element capable of storing information when its electric resistance is changed by application of a voltage pulse and arranged in at least one direction of a row direction and column direction, and provided by connecting one end of each of the memory cells in the same row to a common word line and the other end of each of the memory cells in the same column to a common bit line, and it is characterized as first characteristics in that at least one of a voltage amplitude and a pulse width of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an electric resistance change of the variable resistance element after programming or erasing falls within a certain range regardless of the arranged position in the memory cell array according to an effective voltage amplitude or pulse width of a voltage pulse applied to the variable resistance element of the selected memory cell to be programmed or erased among the memory cells in the memory cell array.

A semiconductor memory device according to the present invention to attain the above object includes a memory cell array provided with memory cells each having a variable resistance element capable of storing information when its electric resistance is changed by application of a voltage pulse and arranged in at least one direction of a row direction and column direction, and provided by connecting one end of each of the memory cells in the same row to a common word line and the other end of each of the memory cells in the same column to a common bit line, and it is characterized as second characteristics in that a voltage amplitude of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an effective voltage amplitude of the voltage pulse applied to the variable resistance element of the selected memory cell to be programmed, erased or read among the memory cells in the memory cell array falls within a certain range regardless of the arranged position in the memory cell array.

The semiconductor memory device having any one of the above characteristics according to the present invention is characterized as third characteristics in that at least one of a voltage applied to ends of unselected word lines not connected to the selected memory cell among the word lines and a voltage applied to unselected bit lines not connected to the selected memory cell among the bit lines is adjusted based on the arranged position of the selected memory cell in the memory cell array during a memory action.

The semiconductor memory device having any one of the above characteristics according to the present invention is characterized as fourth characteristics in that when it is assumed that a voltage difference between the ends of the selected word line and the selected bit line is $V_{BW}$, the effective voltage amplitude applied to the variable resistance element of the selected memory cell is $V_R$, an electric resistance value of the variable resistance element is R, and a total of wiring resistance from the ends of the selected word line and the selected bit line to the selected memory cell is $R_{LINE}$, the voltage difference $V_{BW}$ is adjusted so that the effective voltage amplitude $V_R$ given by a formula that $V_R=R/(R+R_{LINE})\times V_{BW}$ is kept constant.

The semiconductor memory device having the above characteristics according to the present invention is further characterized as fifth characteristics in that when it is assumed that a power supply voltage is $V_{DD}$, and a constant common to all the memory cells in the memory cell array is X, the voltage difference $V_{BW}$ is adjusted in proportion to $(R+R_{LINE})$ so as to satisfy a formula that $V_{BW}=X\times(R+R_{LINE})\times V_{DD}$.

The semiconductor memory device having the fourth characteristics according to the present invention is further characterized as sixth characteristics by comprising a voltage adjustment circuit for adjusting a voltage amplitude of a voltage pulse applied to an end of at least one of the selected word line and the selected bit line, wherein the voltage adjustment circuit includes a plurality of switching circuits the number of which is not more than the total number of the memory cells in the memory cell array, and the plurality of switching circuits are turned ON/OFF by a decode signal selecting at least one of the selected word line and the selected bit line.

The semiconductor memory device having the fifth characteristics according to the present invention is further characterized as seventh characteristics by including a voltage adjustment circuit for adjusting a voltage amplitude of a voltage pulse applied to an end of at least one of the selected word line and the selected bit line, wherein the voltage adjustment circuit includes a plurality of switching circuits the number of which is not more than the total number of the memory cells in the memory cell array and an amplifier, and the plurality of switching circuits are turned ON/OFF by a decode signal selecting at least one of the selected word line and the selected bit line, an output voltage V1 of the switching circuit controlled to be in the ON state is adjusted so as to satisfy a formula that $V1=Y\times(R+R_{LINE})\times V_{DD}$, where Y is a constant, and the voltage difference $V_{BW}$ is provided by amplifying the output voltage V1 by the amplifier.

A semiconductor memory device according to the present invention to attain the above object includes a memory cell array provided with memory cells each having a variable resistance element capable of storing information when its electric resistance is changed by application of a voltage pulse and arranged in at least one direction of a row direction and column direction, and provided by connecting one end of each of the memory cells in the same row to a common word line and the other end of each of the memory cells in the same column to a common bit line, and it is characterized as eighth characteristics in that a pulse width of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an electric resistance change of the variable resistance element after programming or erasing falls within a certain range regardless of the arranged position in the memory cell array according to an effective pulse width of a voltage pulse applied to the variable resistance element of the selected memory cell to be programmed or erased among the memory cells in the memory cell array.

The semiconductor memory device having the above characteristics is characterized as ninth characteristics in that the pulse width is adjusted by the number of pulses of the voltage pulse discretely applied to an end of at least one of the selected word line and the selected bit line.

The semiconductor memory device having any one of the above characteristics according to the present invention is further characterized as tenth characteristics in that the memory cell array is provided with the memory cells arranged in a row direction and a column direction, and by connecting one end of the variable resistance element as one terminal of each of the memory cells in the same row to the common word line, and the other end of the variable resistance element as the other terminal of each of the memory cells in the same column to the common bit line.

Effect of the Invention

According to the semiconductor memory device in the first or second characteristics in the present invention, since the voltage amplitude of the applied voltage pulse is adjusted based on the arranged position of the selected memory cell in the memory cell array, the effective voltage applied to the variable resistance element of each memory cell can fall within a certain range, so that the memory cell array in which there is small variation in characteristics of the variable resistance elements among the memory cells can be implemented. Thus, the semiconductor memory device having a small variation in characteristics among memory cells can be implemented.

Furthermore, according to the present invention, since the effective voltage applied to the variable resistance element of each memory cell can fall within a certain range, the variation in pulse width of the voltage pulse when the resistance value reaches the peak can be reduced. In addition, according to the present invention, since the effective voltage applied to the variable resistance element of the memory cell can fall within a certain range, the variation in resistance value when each memory cell is in a high resistance state and a low resistance state can be reduced.

According to the semiconductor memory device having the first or eighth characteristics, since the pulse width of the applied voltage pulse is adjusted based on the arranged position of the selected memory cell in the memory cell array in order to adjust the difference in effective voltage at the time of programming or erasing action, the difference in resistance value after the programming or erasing action due to the difference in effective voltage applied to the variable resistance element of each memory cell can fall within a certain range, so that the memory cell array having small variation in characteristics of the variable resistance elements among memory cells can be implemented. Thus, the semiconductor memory device having a small variation in characteristics among memory cells can be implemented.

EXPLANATION OF REFERENCES

Figure 1:
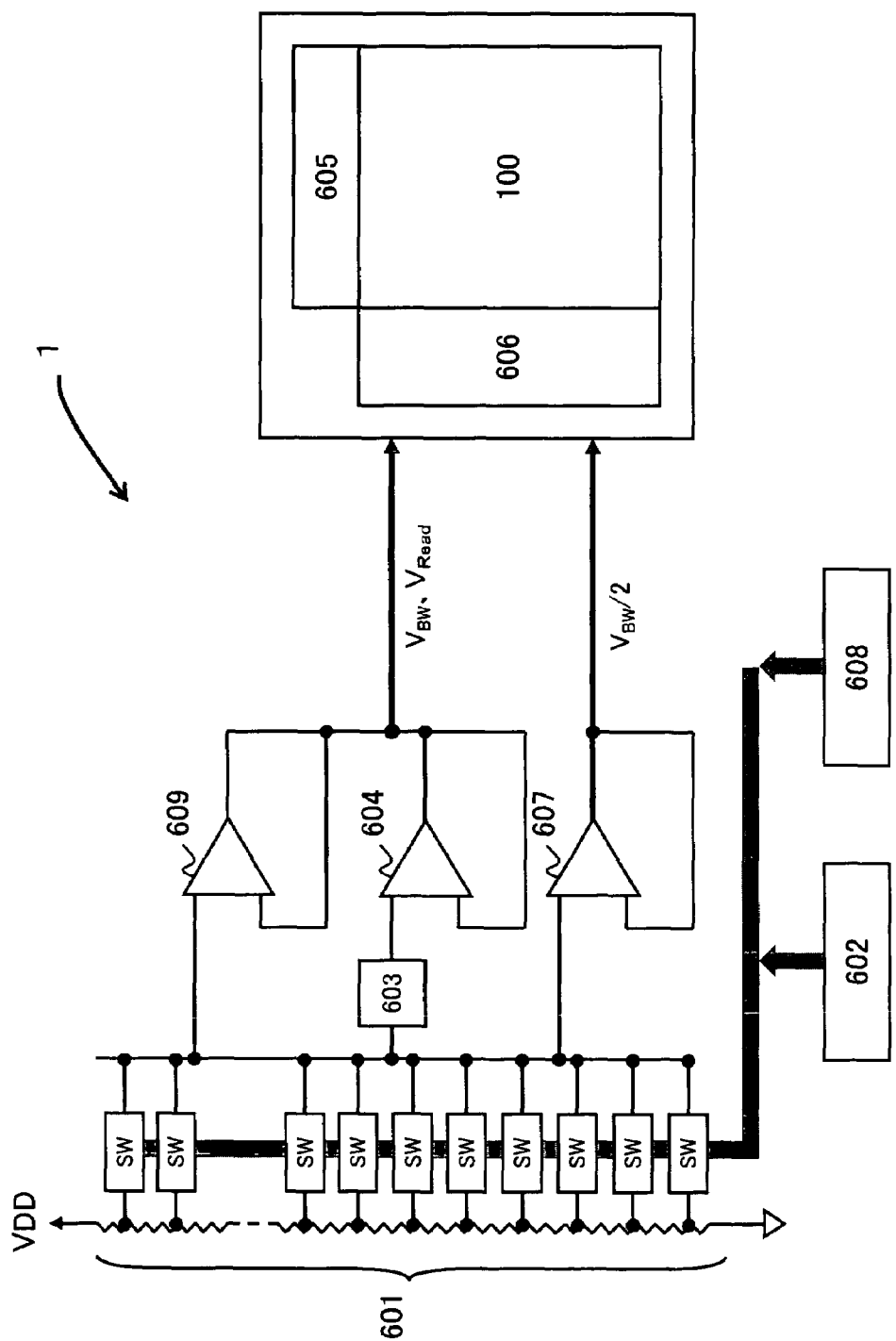
FIG. 1 is a block diagram showing a schematic constitution of a first embodiment of a semiconductor memory device according to the present invention.

1: Semiconductor memory device according to the present invention
100: Memory cell array
101: Bit line
102: Word line
103: Variable resistance element
200: Memory cell array
201: Lower electrode
202: Variable resistor
203: Upper electrode
601: Switching circuit group
602: Address decoder
603: Amplification circuit
604: Amplifier
605: Column decoder
606: Row decoder
607: Amplifier
608: Row address decoder
609: Amplifier
610: Pulse width adjustment circuit
611: Counter circuit
612: Pulse generation circuit
613: Inverter circuit
614: NAND circuit
610: Pulse width adjustment circuit
620: Pulse number adjustment circuit
701: Selected memory cell
702: Selected bit line
703: Selected word line
901: Amplification circuit
1001: Selected memory cell
1002: Selected bit line
1003: Selected word line
1201: Selected memory cell
1202: Selected bit line
1203: Selected word line
1204: Sense amplifier

BEST MODE FOR CARRYING OUT THE INVENTION

Embodiments of a semiconductor memory device according to the present invention (referred to as the device of the present invention occasionally hereinafter) will be described with reference to the drawings.

First Embodiment

A first embodiment of the device of the present invention will be described with reference to FIGS. 1 to 5. Here, FIG. 1 is a schematic block diagram showing a constitution of the device of the present invention. As shown in FIG. 1, a device 1 of the present invention includes a memory cell array 100, a switching circuit group 601, an address decoder 602 for a writing signal, a column decoder 605, row decoder 606, and row address decoder 608.

Figure 2:
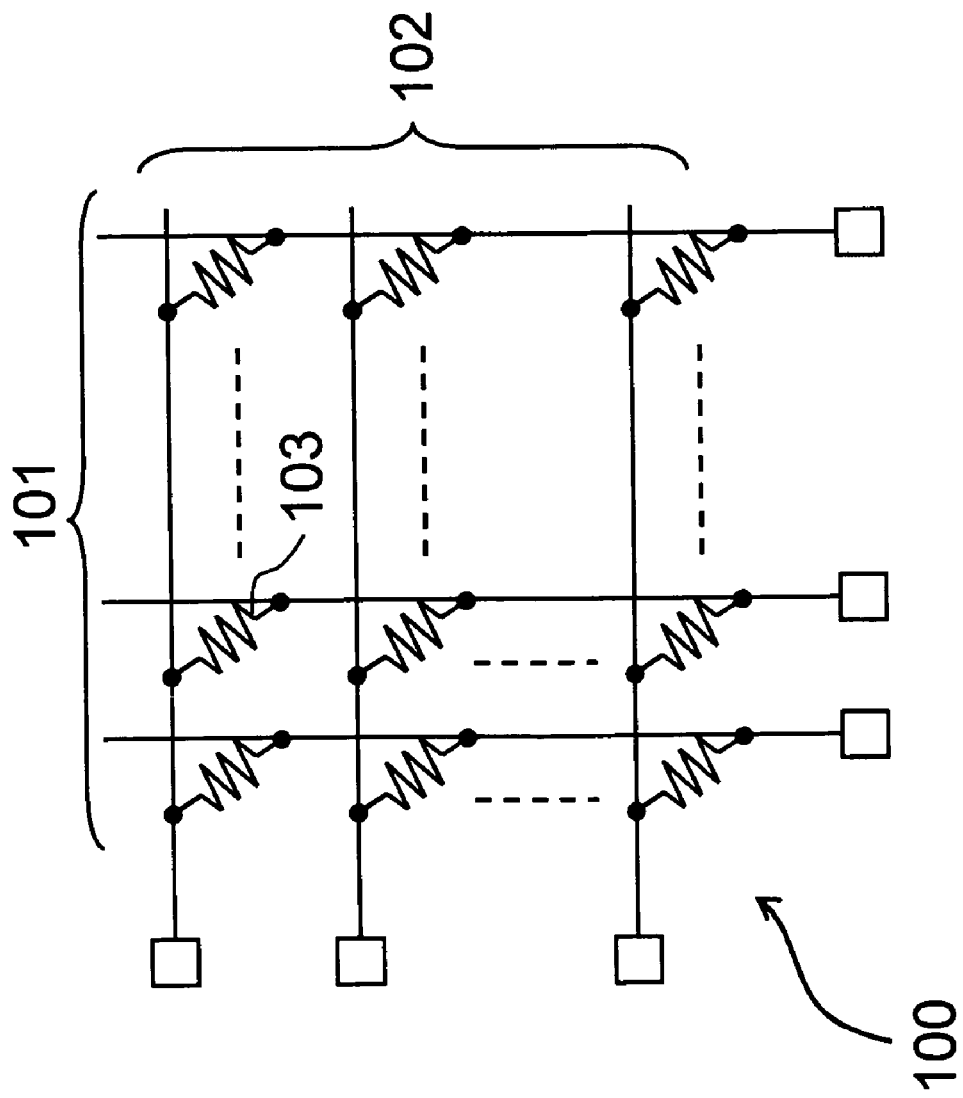
FIG. 2 is an explanatory diagram showing a schematic outline of a memory cell array of the semiconductor memory device according to the present invention.

The memory cell array 100 has the same circuit constitution as in the conventional art, in which a plurality of memory cells each including a variable resistance element 103 having electric resistance changed by application of a voltage pulse and storing information by the change of the electric resistance, are arranged in at least one direction of a row direction and column direction and one terminals of the memory cells in the same row are connected to a common word line 102, and the other terminals of the memory cells in the same column are connected to a common bit line 101 as shown in FIG. 2. More specifically, as shown in FIG. 2, in the memory cell array 100, the memory cells are arranged in the row direction and the column direction, one end of the variable resistance element 103 that is one terminal of the memory cells in the same row is connected to the common word line 102, and the other end of the variable resistance element 103 that is the other terminal of the memory cells in the same column is connected to the common bit line 101. In addition, as for the variable resistance element 103 used here, its resistance value is changed when the potential between the bit line 101 and the word line 102 exceeds a certain threshold value $V_{TH}$.

The switching circuit group 601 functions as a voltage adjustment circuit for adjusting a voltage amplitude of a voltage pulse applied to an end of at least one of a selected word line and a selected bit line, together with an amplification circuit 603 as an amplifier, and includes switching circuits SW whose number is not more than the number of memory cells of the memory cell array 100. In addition, the plurality of switching circuits SW are turned ON/OFF by a decode signal that selects at least one of the selected word line and the selected bit line. According to the present embodiment, the switching circuit SW selected by a signal from the address decoder 602 is turned ON. The voltage difference $V_{BW}$ between the ends of the selected word line and the selected bit line connected to a selected memory cell is provided by amplifying an output voltage $V_1$ of the switching circuit SW by the amplification circuit 603.

The adjustment of the voltage pulse in the device 1 of the present invention will be described with reference to FIGS. 3 to 5. The device 1 of the present invention is so constituted that the voltage amplitude of the voltage pulse applied to an end of at least one of the selected word line connected to the selected memory cell among the word lines 102 and the selected bit line connected to the selected memory cell among the bit lines 101 is adjusted based on the position of the selected memory cell in the memory cell array 100 so that an effective voltage amplitude of the voltage pulse applied to the variable resistance element 103 of the selected memory cell to be programmed or erased in the memory cell array 100 can be within a certain range regardless of the position in the memory cell array 100 at the time of a predetermined memory action. Furthermore, the device 1 of the present invention according to the present embodiment is so constituted that at least one of the voltage applied to the ends of unselected word lines that is not connected to the selected memory cell among the word lines 102 and the voltage applied to unselected bit lines that is not connected to the selected memory cell among the bit lines 101 is adjusted based on the position of the selected memory cell in the memory cell array 100 at the time of the memory action.

In addition, the predetermined memory action is at least one of a programming action to increase or decrease the electric resistance of the variable resistance element 103, a reset action to change the electric resistance of the variable resistance element 103 to the state before the programming action, and a reading action to read stored information in accordance with the state of the electric resistance of the variable resistance element 103.

First, the voltage adjustment at the time of programming action and the reset action will be described with reference to FIGS. 3 and 4.

According to the formula 1, it can be seen that in order to keep an effective voltage $V_R$ applied to the variable resistance element 103 of the selected memory cell within a predetermined range regardless of different wiring lengths L, the voltage difference $V_{BW}$ is to be changed according to the wiring length L. That is, a relation between the voltage difference $V_{BW}$, a total $R_{LINE}$ of the wiring resistance from ends of the selected word line and the selected bit line to the selected memory cell, and an electric resistance R of the variable resistance element 103 is to satisfy that $V_{BW} \propto (R+R_{line})$. Here, when a weighting factor X having a common value with respect to each memory cell is introduced and a power supply voltage is $V_{DD}$, the voltage difference $V_{BW}$ can be expressed by the following formula 2.

$$V_{BW}=X(R+R_{LINE}) \times V_{DD} \qquad \text{Formula 2}$$

When the weighting factor X is adjusted, the effective voltage $V_R$ can be adjusted to a desired value according to the formulas 1 and 2. In addition, for example, as the weighting factor X, an average value $R_{AVG}$ of wiring resistance may be used and Y which satisfies that $X=Y/(R+R_{AVG})$ may be set.

Therefore, the output $V_1$ of the switching circuit SW according to the present embodiment is adjusted to be $V_1=X'(R+R_{LINE}) \times V_{DD}$ according to the formula 2, and amplified to $V_{BW}$ by the amplification circuit 603. The amplification circuit 603 according to the present embodiment amplifies the output $V_1$ of the switching circuit SW so that $V_{BW}=2 V_1$, where $X'=X/2$. Furthermore, the output $V_{BW}$ of the amplification circuit 603 is inputted to an amplifier 604. The amplifier 604 outputs $V_{BW}$ to one of the selected bit line or the selected word line through the column decoder 605 or the row decoder 606. In addition, the output $V_1$ is outputted from the switching circuit group 601 to an amplifier 607. The amplifier 607 outputs $V_{BW}/2$ (=$V_1$) to the unselected bit lines and the unselected word lines through the column decoder 605 and the row decoder 606. According to the present embodiment, it is to be noted that an amplifier 609 for the reading action is inactivated and its output is in a floating state during the programming action and the reset action.

Figure 3:
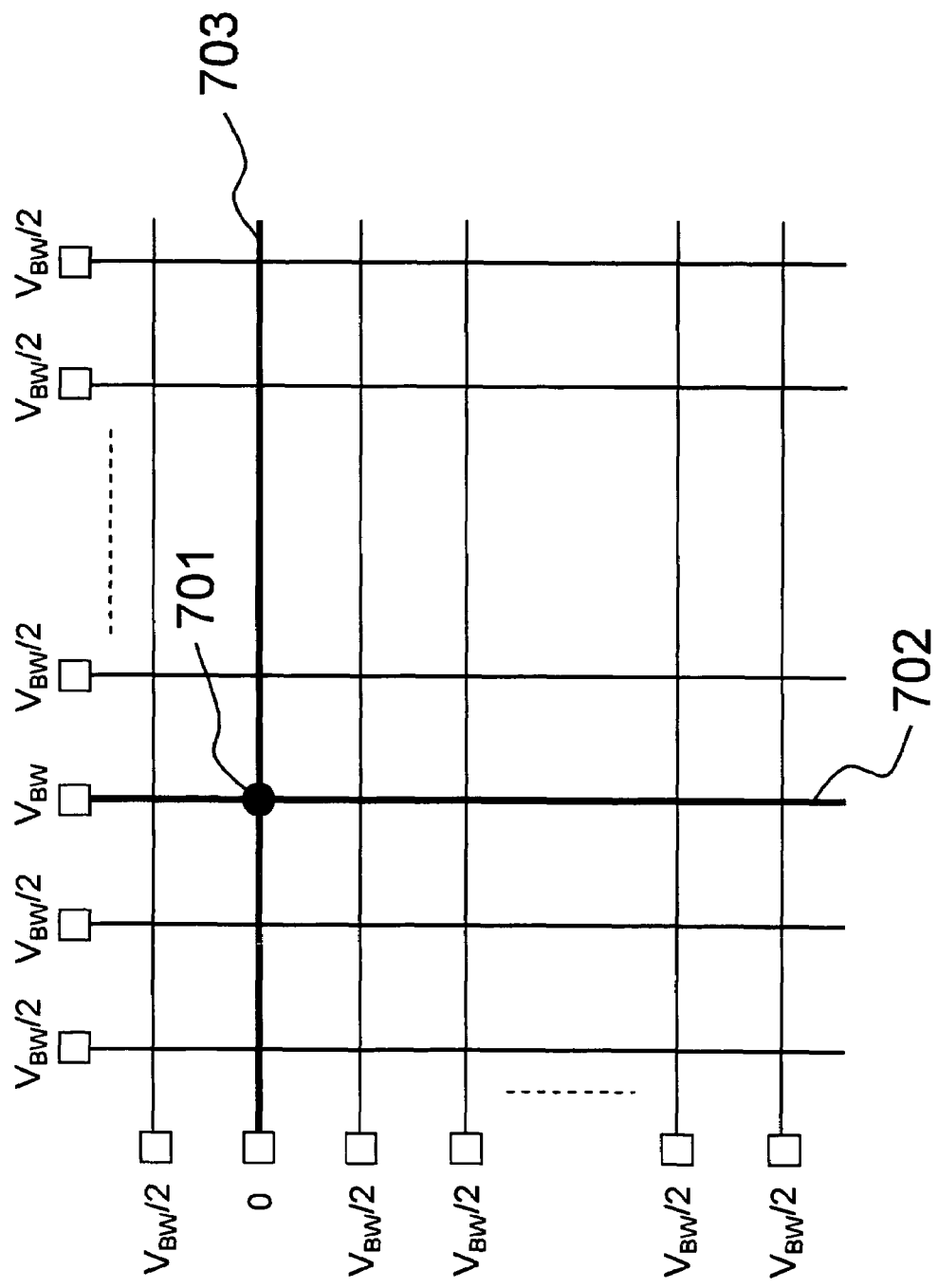
FIG. 3 is a schematic circuit diagram showing a relation between potentials of a bit line and a word line in the memory cell array at the time of programming action in the first embodiment of the semiconductor memory device according to the present invention.

Here, FIG. 3 shows a potential relation between the bit line and the word line in the memory cell at the time of programming action. Here, the output of the amplifier 604 is inputted to a selected bit line 702 through the column decoder 605 and the potential of the selected bit line 702 becomes $V_{BW}$. In addition, since the potential of a selected word line 703 is 0V, the potential difference of a selected memory cell 701 becomes $V_{BW}$. In addition, when $V_{BW}>V_{TH}$, the resistance value of the variable resistance element 103 is changed.

Furthermore, the output of the amplifier 607 is applied to the unselected bit lines and the unselected word lines through the column decoder 605 and the row decoder 606 and the voltage difference of the unselected memory cells connected to the selected bit line 702 becomes $V_{BW}/2=V_1$. In addition, here, when the $V_1$ is adjusted so as to satisfy $V_1<V_{TH}$, the resistance value of the variable resistance elements 103 of the unselected memory cells other than the selected memory cell 701 connected to the selected bit line 702 is not changed. In addition, as for the other unselected memory cells, since the potentials of the unselected bit lines and the unselected word lines are the same and an applied voltage is 0V, the resistance value of the variable resistance element 103 is not changed.

Figure 4:
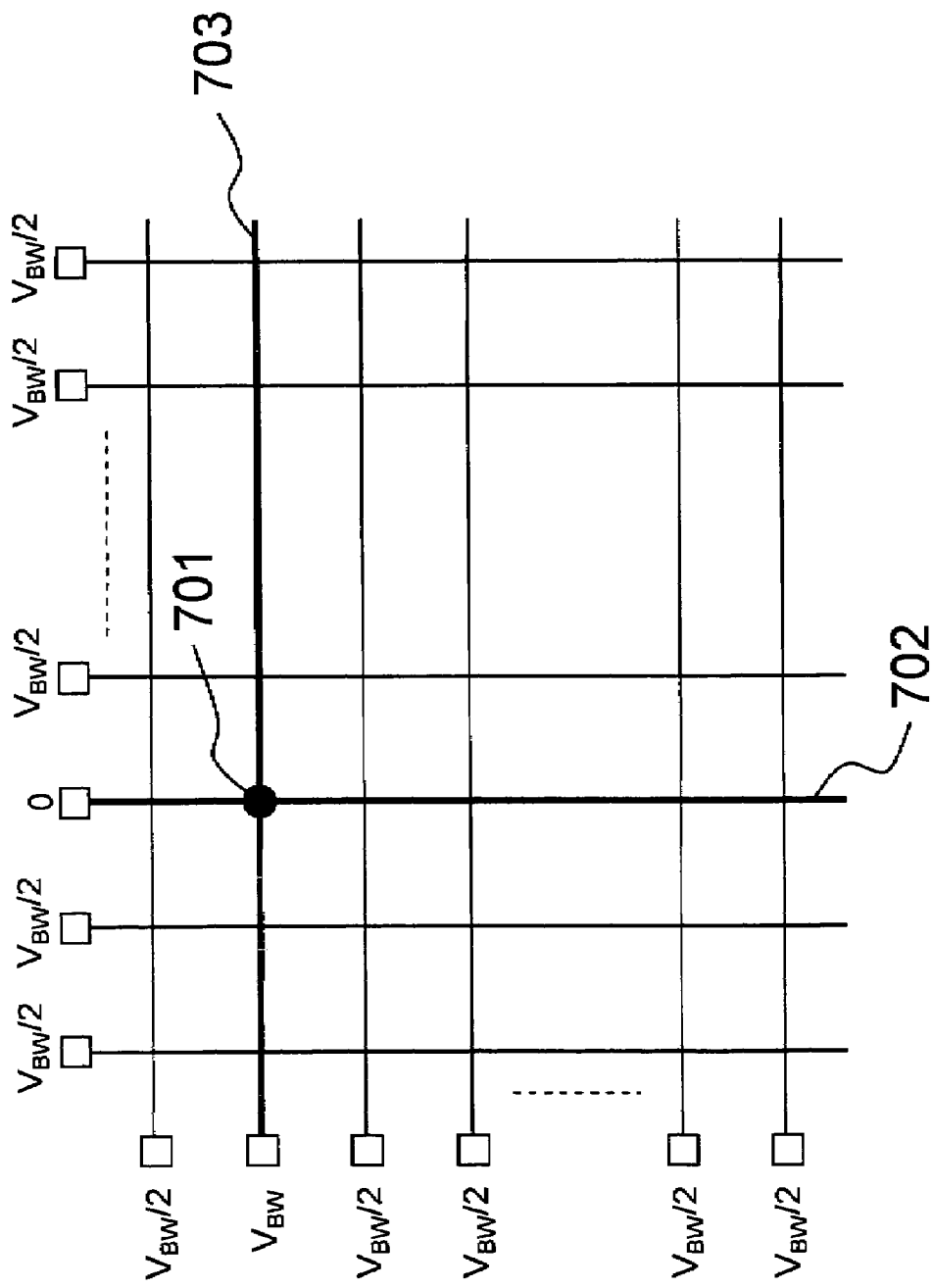
FIG. 4 is a schematic circuit diagram showing a relation between potentials of the bit line and the word line in the memory cell array at the time of reset action in the first embodiment of the semiconductor memory device according to the present invention.

FIG. 4 shows a potential relation between the bit line and the word line in the memory cell at the time of reset action (erasing action). As shown in FIG. 4, the potentials of the bit line and the word line at the time of reset action are provided by reversing the potential of the selected bit line 702 and the potential of the selected word line 703 at the time of programming action. At this time, a voltage having a polarity opposite to that in the programming action is applied to the selected memory cell 701. In addition, although the voltage having the opposite polarity is applied to the unselected memory cells connected to the selected bit line 702 and the selected word line 703, similar to at the time of programming action, when $V_1<V_{TH}$, the resistance value of the variable resistance element 103 is not changed. As for other unselected memory cells, the potentials of the unselected bit lines and the unselected word lines are the same, and the voltage applied to the unselected memory cells is 0V like at the time of programming time, the resistance value of the variable resistance element 103 is not changed.

Therefore, as shown in FIGS. 3 and 4, when the voltage difference $V_{BW}$ is adjusted so as to satisfy the formula 3, the memory cell is prevented from being disturbed.

$$V_{BW}/2<V_{TH}<V_{BW} \qquad \text{Formula 3}$$

Next, voltage adjustment in the reading action will be described with reference to FIG. 5.

In the reading action, the plurality of switching circuits SW of the switching circuit group 601 are turned ON/OFF by the signal from the row address decoder 608 for the reading action. The output voltage $V_{Read}$ of the switching circuit SW is expressed by the following formula 4.

$$V_{Read}=X''(R+R_{LINE}) \times V_{DD} \qquad \text{Formula 4}$$

Here, X" is a weighting factor. The output voltage $V_{Read}$ of the switching circuit SW is inputted to the row decoder 606 through the amplifier 609 for the reading action. In addition, according to the present embodiment, it is to be noted that the amplifier 604 and the amplifier 607 for the programming and reset actions are inactivated and their outputs are in the floating state at the time of reading action.

Figure 5:
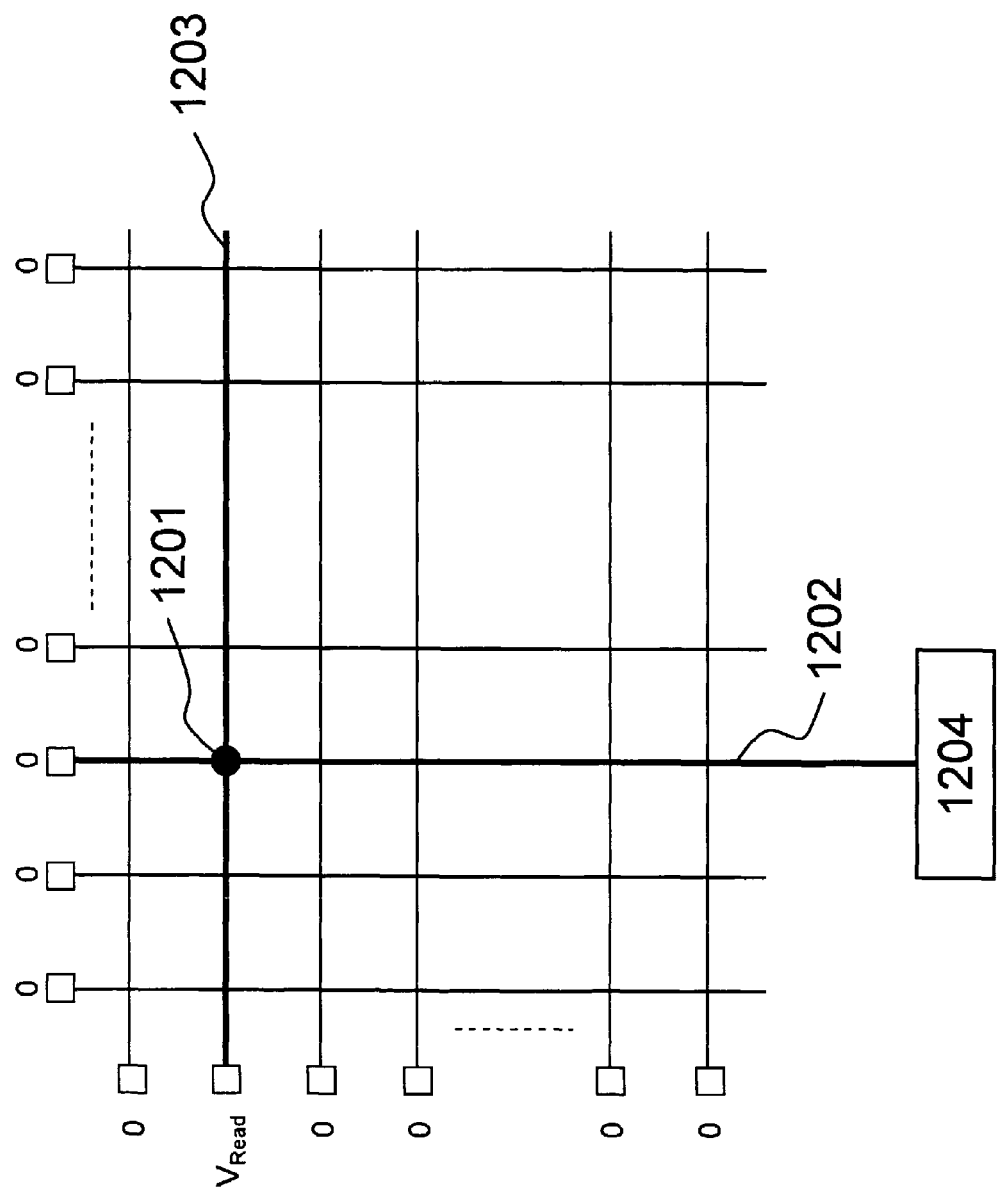
FIG. 5 is a schematic circuit diagram showing a relation between potentials of the bit line and the word line in the memory cell array at the time of reading action in the semiconductor memory device according to the present invention.

FIG. 5 shows a potential relation between the bit line and the word line in the memory cell array 100 at the time of reading action. Here, the potential of a selected word line 1203 connected to a selected memory cell 1201 is $V_{Read}$ and the potential of other unselected word lines is at 0V. In addition, the potential of all bit lines containing a selected bit line 1202 connected to the selected memory cell 1201 is set to 0V. Since a current flowing in the selected bit line 1202 is increased or decreased according to the resistance value of the variable resistance element 103 of the selected memory cell 1201, the current is amplified by a sense amplifier 1204 connected to the selected bit line 1202, to read data.

Here, when the weighting factor X" in the formula 4 is set so as to satisfy $V_{Read}<V_{TH}$, or $V_{DD}$ is set so as to be for the reading action only, a nondestructive reading of the memory cell can be implemented, so that reprogramming after the reading is not necessary.

Figure 6:
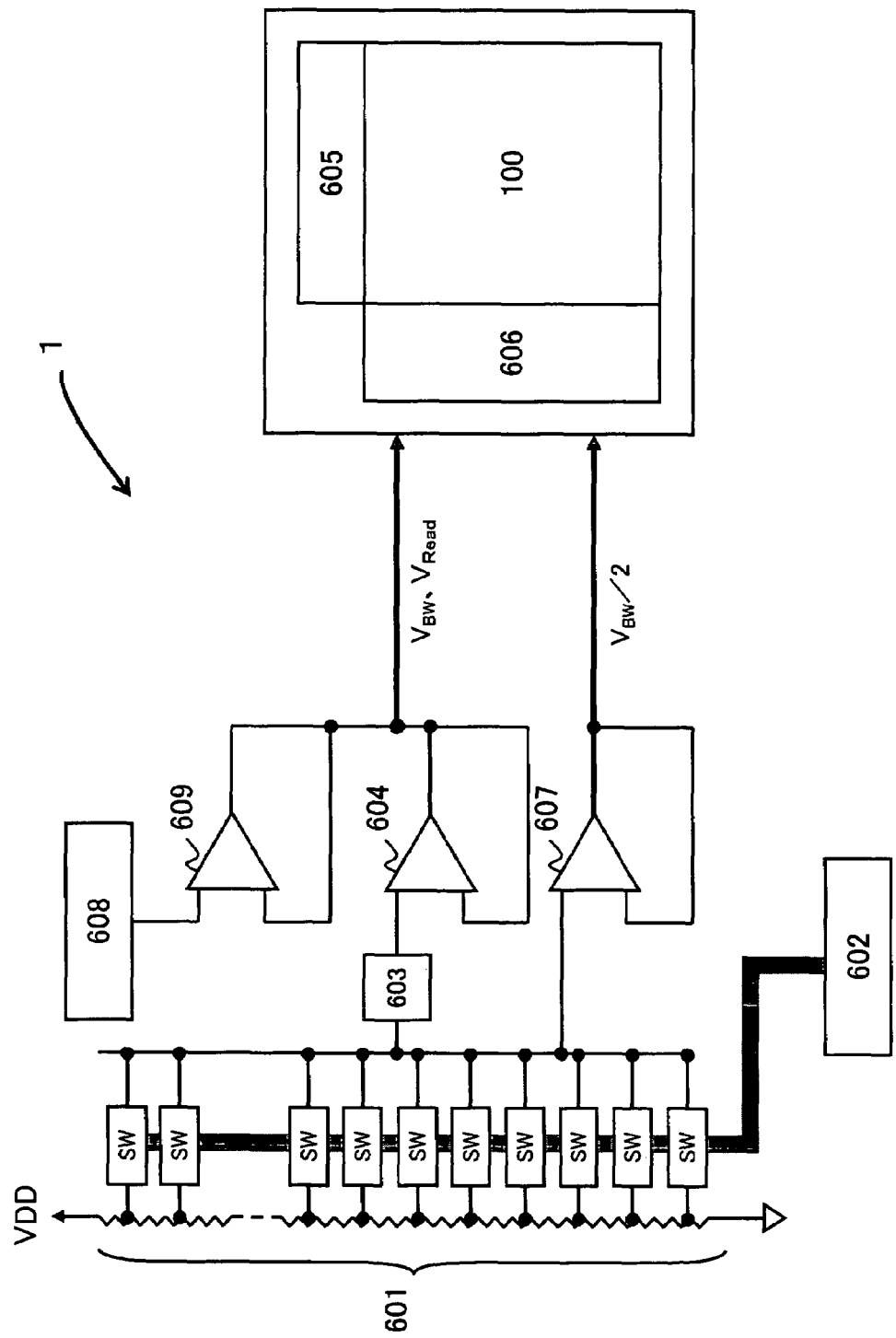
FIG. 6 is a block diagram showing a schematic constitution of another embodiment of a semiconductor memory device according to the present invention.

In addition, in the reading action, it is expected that the difference of the wiring resistance depending on the position in the memory cell array 100 has a small influence as compared with that in the programming action and the reset action. In this case, as shown in FIG. 6, for example, the output of the row address decoder 608 may be set to a constant value $V_{Read}$ and inputted directly to the amplifier 609 without passing through the switching circuit group 601.

Figure 7:
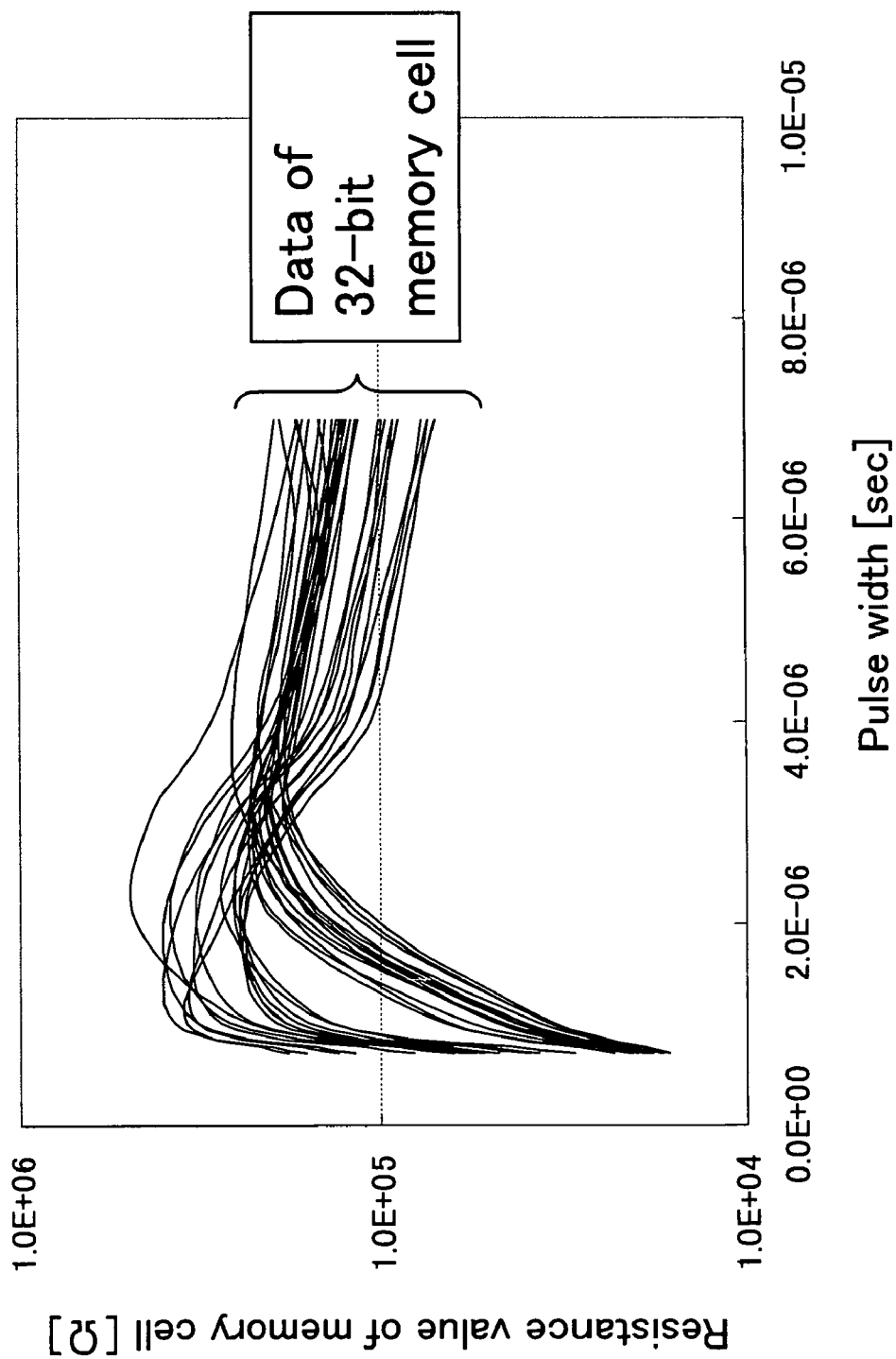
FIG. 7 is a graph showing a relation between a resistance value of a variable resistance element and a pulse width of an applied voltage in a semiconductor memory device according to a conventional art.
Figure 8:
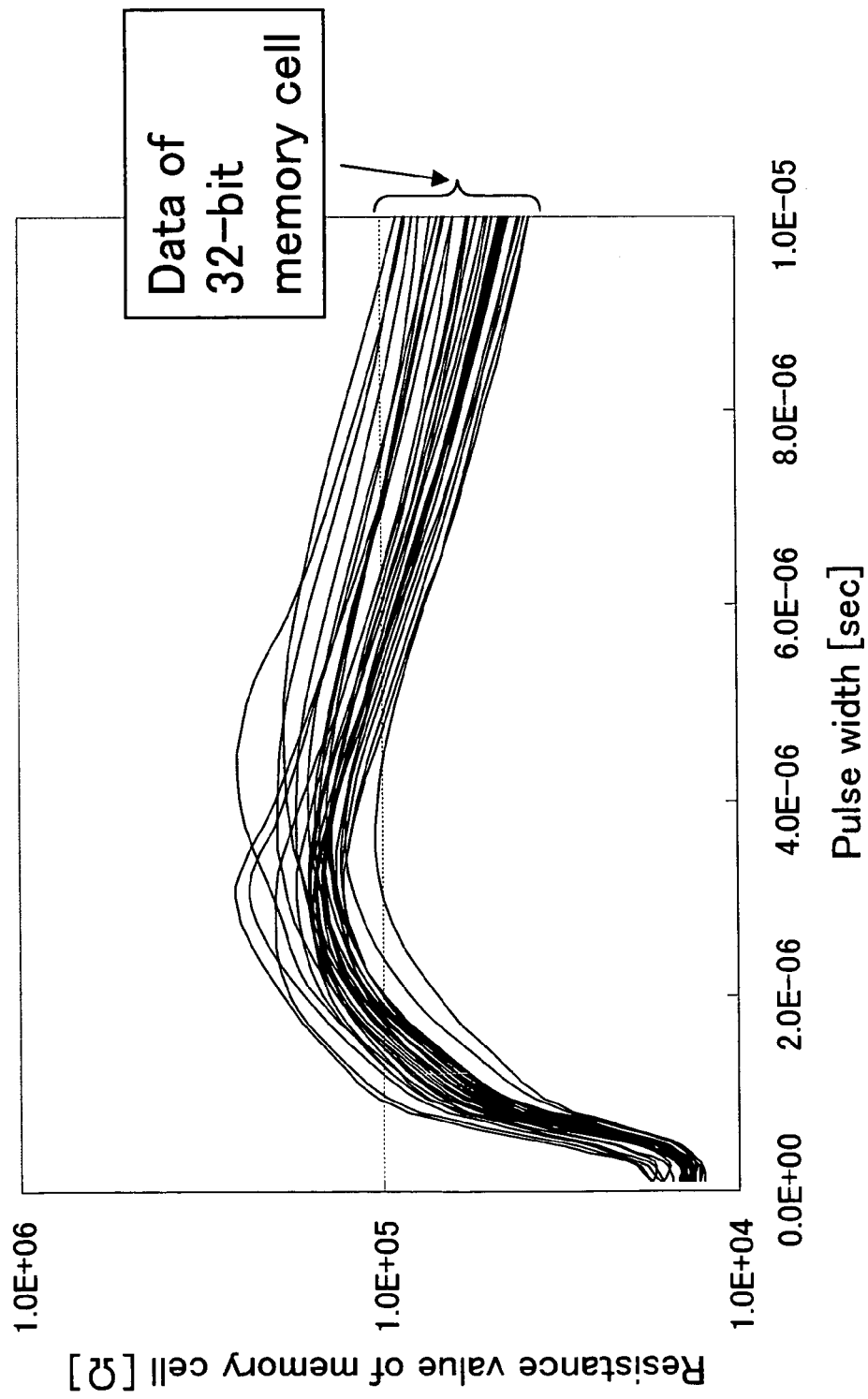
FIG. 8 is a graph showing a relation between a resistance value of a variable resistance element and a pulse width of an applied voltage in the semiconductor memory device according to the present invention.

Here, FIGS. 7 and 8 show a relation between a resistance value of a variable resistance element 103 and a pulse width of an applied voltage in a 64-bit memory cell array 100 having eight bit lines and eight word lines and memory cells formed at the intersections of the bit lines and the word lines. According to the conventional art as shown in FIG. 7, there is a variation in pulse width among memory cells when the resistance value of the variable resistance element 103 reaches its peak. Meanwhile, according to the device 1 of the present invention, as shown in FIG. 8, the variation in pulse width among memory cells when the resistance value of the variable resistance element 103 reaches its peak can be small.

Figure 9:
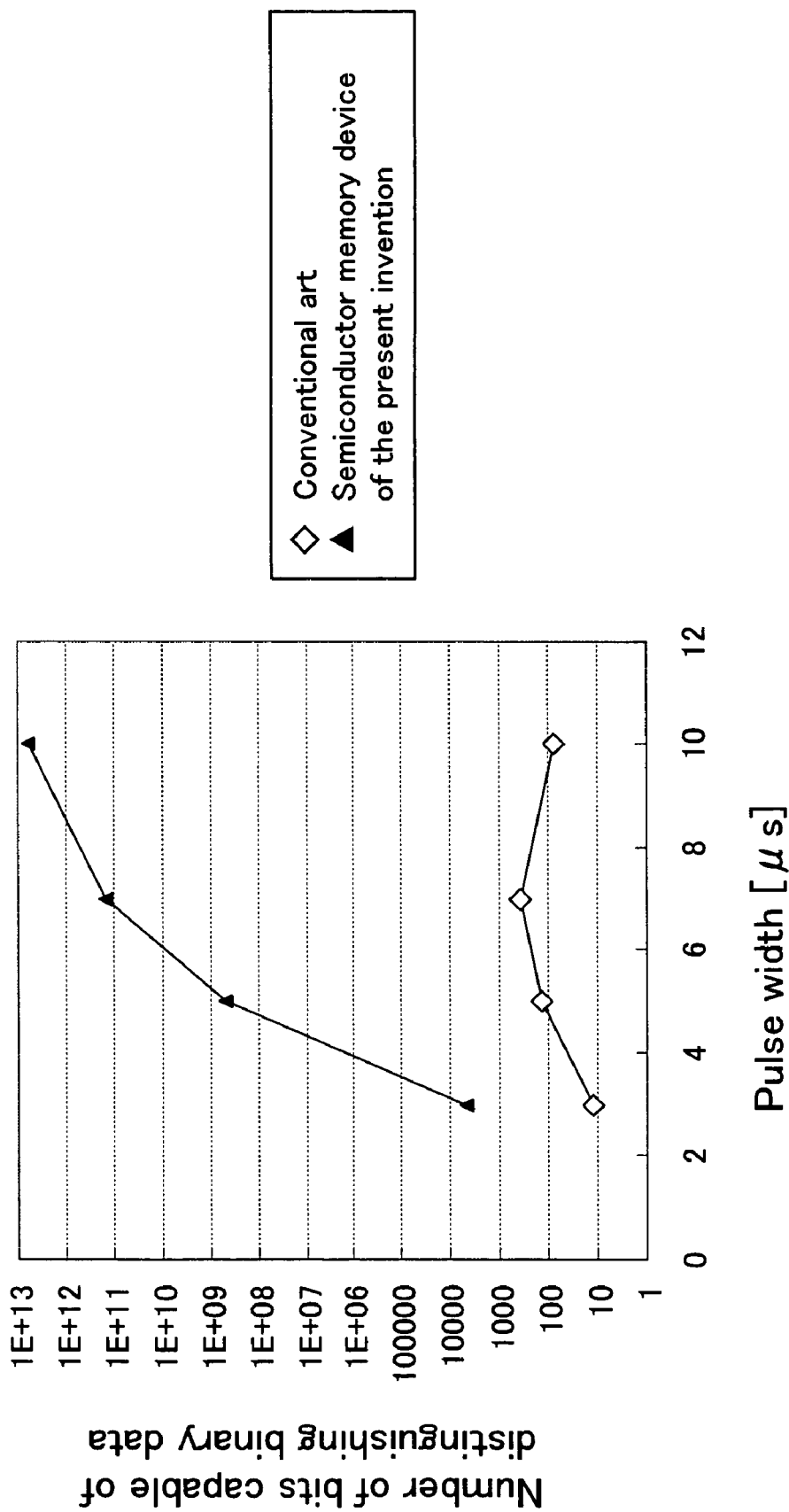
FIG. 9 is a graph showing a relation between an upper limit bit number capable of separating into a high resistance state and a low resistance state and the pulse width of the applied voltage in each of the semiconductor memory devices according to the present invention and the conventional art.

In addition, FIG. 9 shows a relation between the upper limit number of bits in which a high resistance state and a lower resistance state can be separated and a pulse width of an applied voltage which is estimated based on a 32-bit memory cell array 100 having eight bit lines and four word lines and memory cells formed at intersections of the bit lines and the word lines. As shown in FIG. 9, since the upper limit number of bits is at most several hundred bits in the conventional art, and the resistance of a variable resistance element 103 of the memory cell is not satisfactorily changed by the application of the voltage pulse having a pulse width of 3 μs. Meanwhile, according to the device 1 of the present invention, the number of bits is improved to about 5000 bits by the pulse having a pulse width of 3 μs. Furthermore, in a case of the pulse width of 10 μs, it is improved to be more than 1 T bits. Therefore, according to the present invention, the variation in resistance value in the high resistance state and the low resistance state can be reduced in each memory cell, which means that a semiconductor memory device having a large memory cell array 100 can be implemented.

Second Embodiment

A second embodiment of the device 1 of the present invention will be described with reference to FIGS. 10 to 12. According to the present embodiment, a description will be made of a case where a constitution regarding the programming action and reset action of the device 1 of the present invention is different from that in the first embodiment. In addition, since the reading action is the same as that of the first embodiment, its description will be omitted.

Figure 10:
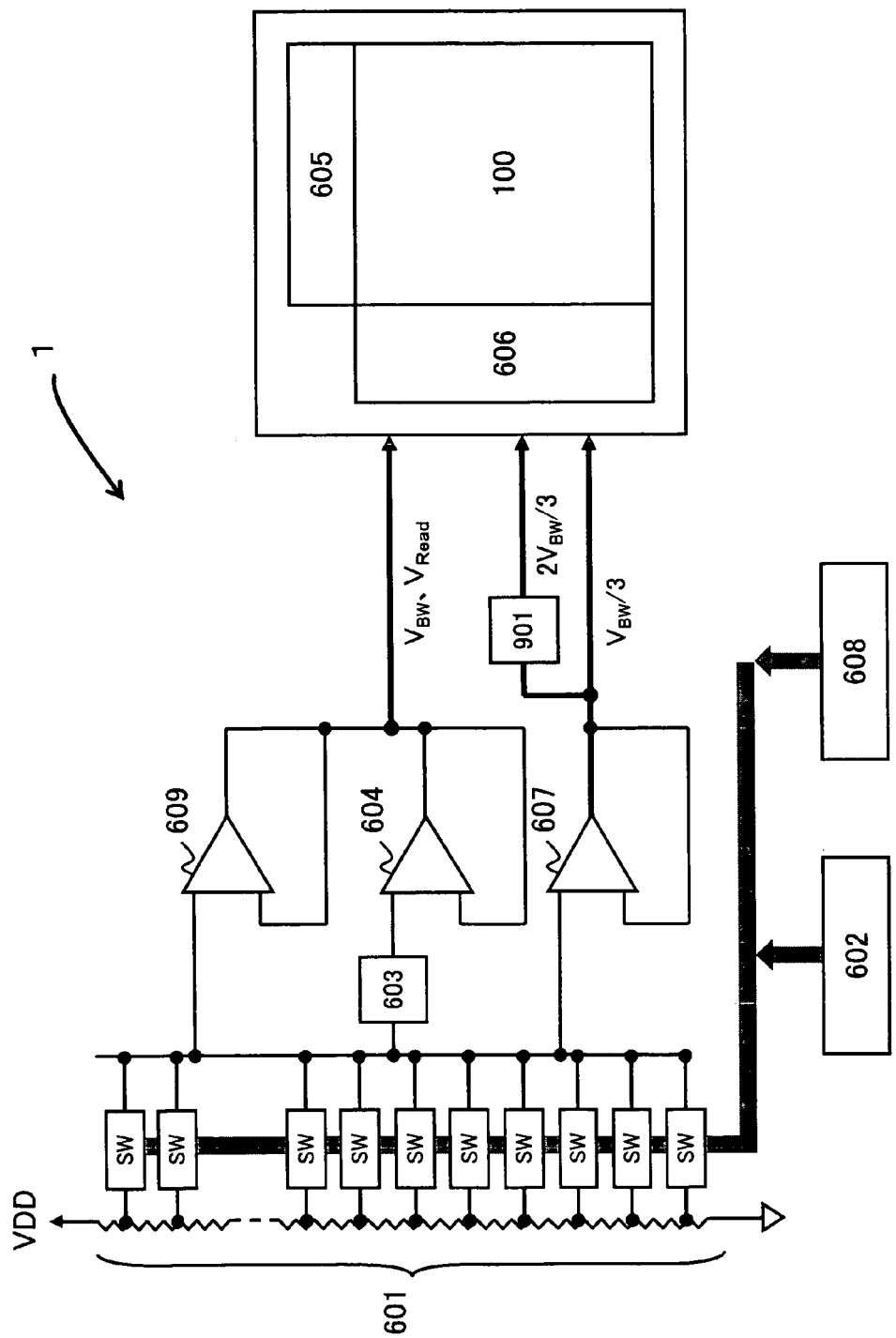
FIG. 10 is a block diagram showing a schematic constitution of a second embodiment of a semiconductor memory device according to the present invention.

Here, FIG. 10 is a block diagram showing a schematic constitution of a device 1 of the present invention according to the present embodiment. According to the present embodiment, in addition to the constitution of the first embodiment, an amplification circuit 901 is provided. More specifically, a switching circuit SW and an amplification circuit 603 in the present embodiment is so constituted that $V_{BW}=3V_1$. The output of an amplifier 607 is divided into two and one is inputted to a column decoder 605 and a row decoder 606 as $V_1$, and the other is inputted to the amplification circuit 901. The amplification circuit 901 amplifies the $V_1$ outputted from the amplifier 607 to $2V_1$ and outputs it to the column decoder 605 and the row decoder 606. In addition, according to the present embodiment, at the time of programming action and reset action, an amplifier 609 for a reading action is inactivated and its output is in a floating state. At the time of reading action, an amplifier 604 and the amplifier 607 for the programming action and the reset action are inactivated and their outputs are in the floating state.

Figure 11:
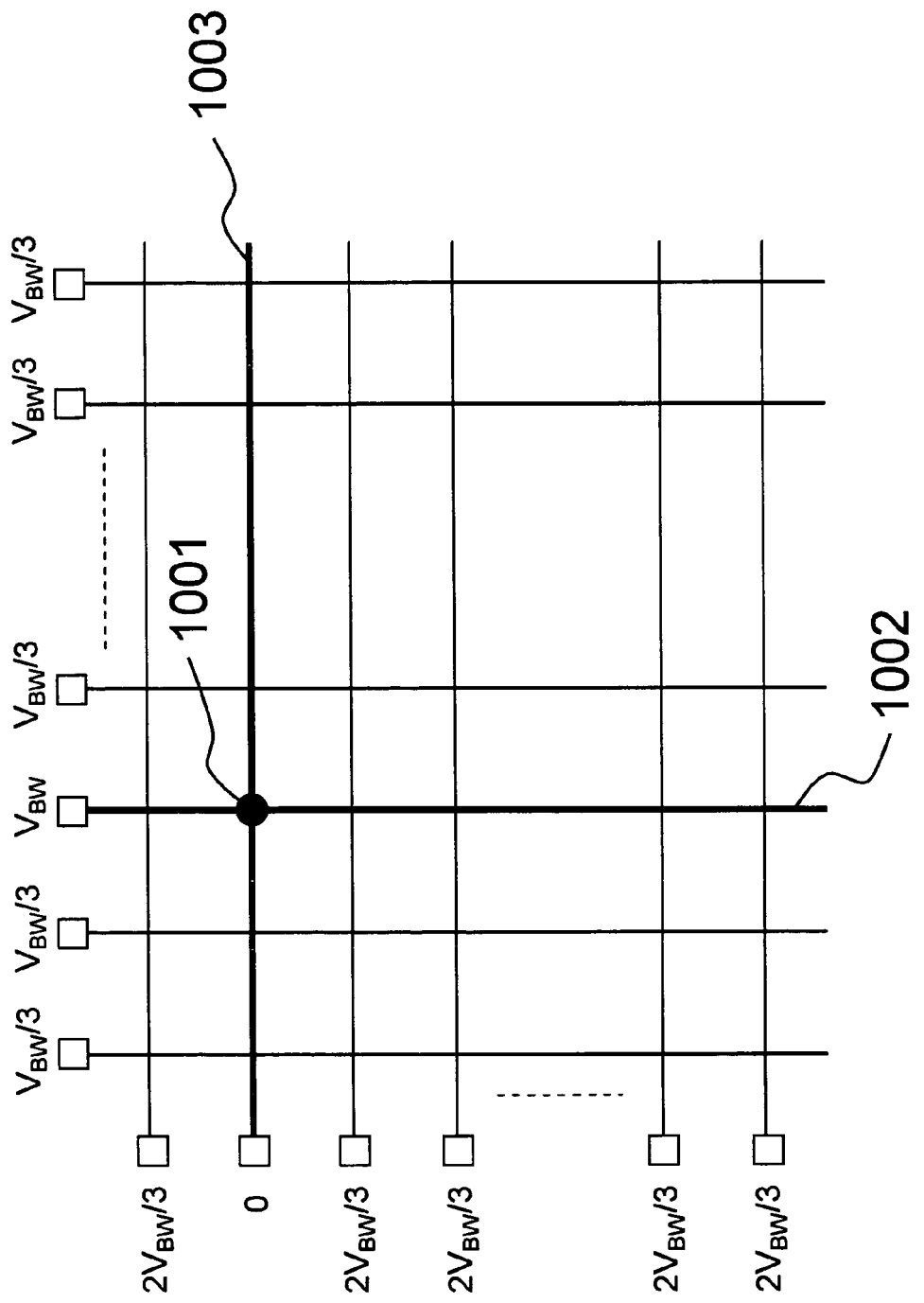
FIG. 11 is a schematic circuit diagram showing a relation between potentials of a bit line and a word line in a memory cell array at the time of programming action in the second embodiment of the semiconductor memory device according to the present invention.

FIG. 11 shows a potential relation between the bit line and the word line in the memory cell array at the time of programming action. Here, an output $V_{BW}$ from the amplifier 604 is applied to a selected bit line 1002 through the column decoder 605 and the potential of the selected bit line 1002 is the voltage difference $V_{BW}$, the potential of a selected word line 1003 is 0V, and a voltage difference of a selected memory cell 1001 is the $V_{BW}$ similar to the first embodiment. In addition, when $V_{BW}>V_{TH}$, a resistance value of a variable resistance element 103 is changed.

Furthermore, the output of the amplifier 607 is inputted to unselected bit lines so that the potential of the unselected bit lines becomes $V_{BW}/3$ and the output of the amplification circuit 901 is inputted to unselected word lines so that the potential of the unselected word lines becomes $2V_{BW}/3$. As a result, a potential difference of unselected memory cells other than the selected memory cell 1001 becomes such that $V_{BW}/3=V_1$. In addition, when $V_1<V_{TH}$, the resistance value of the variable resistance element 103 is not changed.

Figure 12:
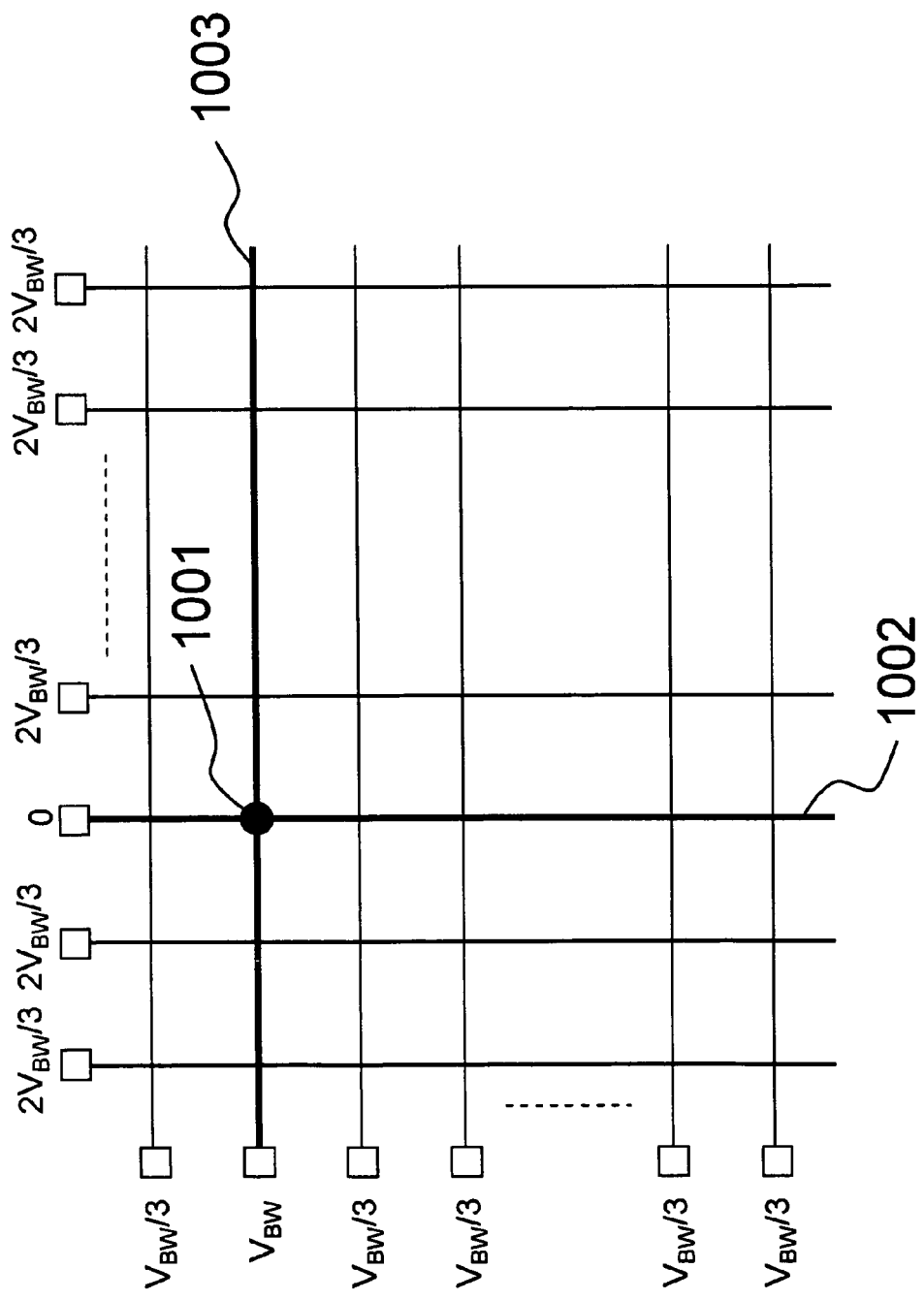
FIG. 12 is a schematic circuit diagram showing a relation between potentials of the bit line and the word line in the memory cell array at the time of reset action in the second embodiment of the semiconductor memory device according to the present invention.
Figure 13:
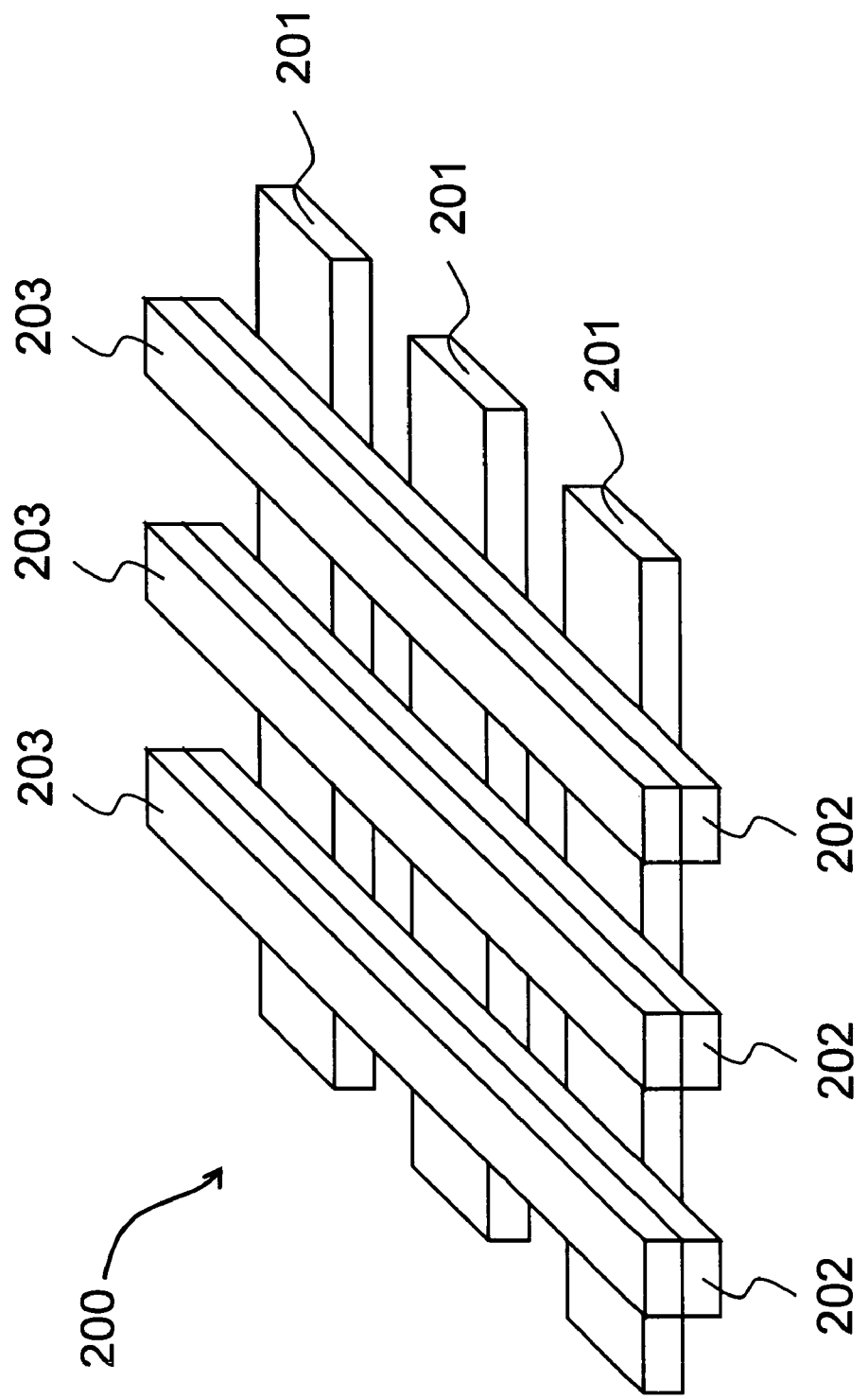
FIG. 13 is a schematic block diagram showing a constitution of a memory cell array having a cross point structure according to the conventional art.
Figure 14:
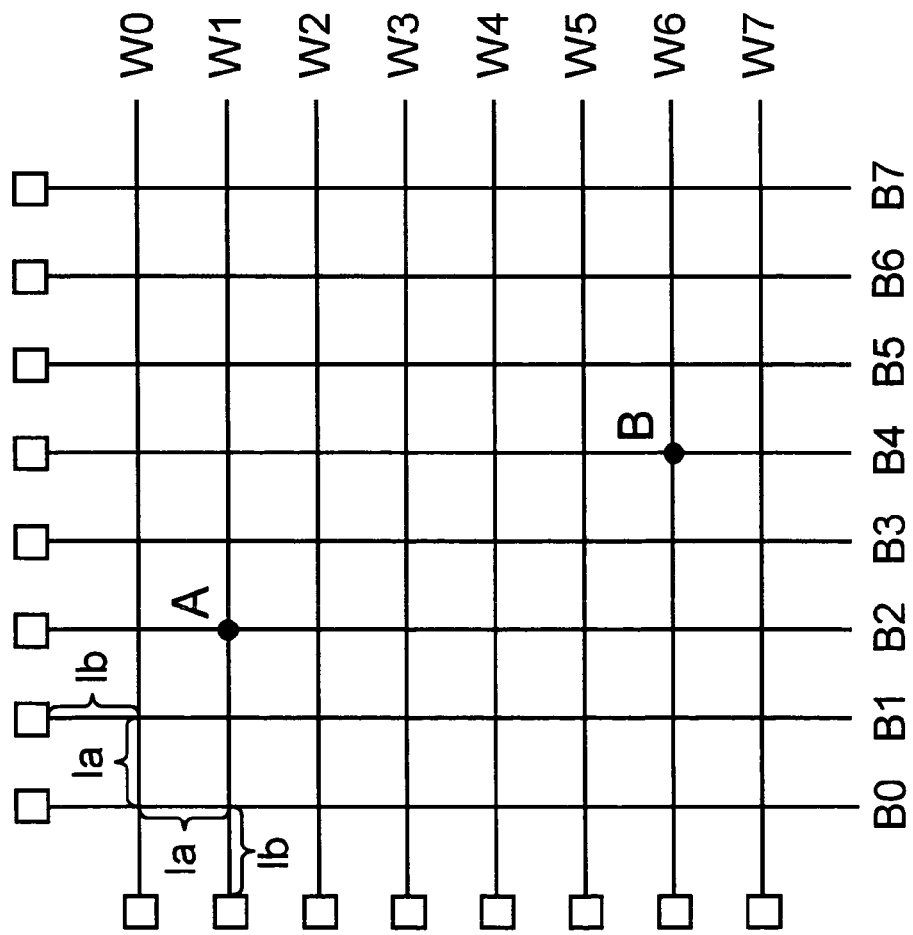
FIG. 14 is a schematic explanatory diagram showing the constitution of the memory cell array having the cross point structure according to the conventional art.
Figure 15:
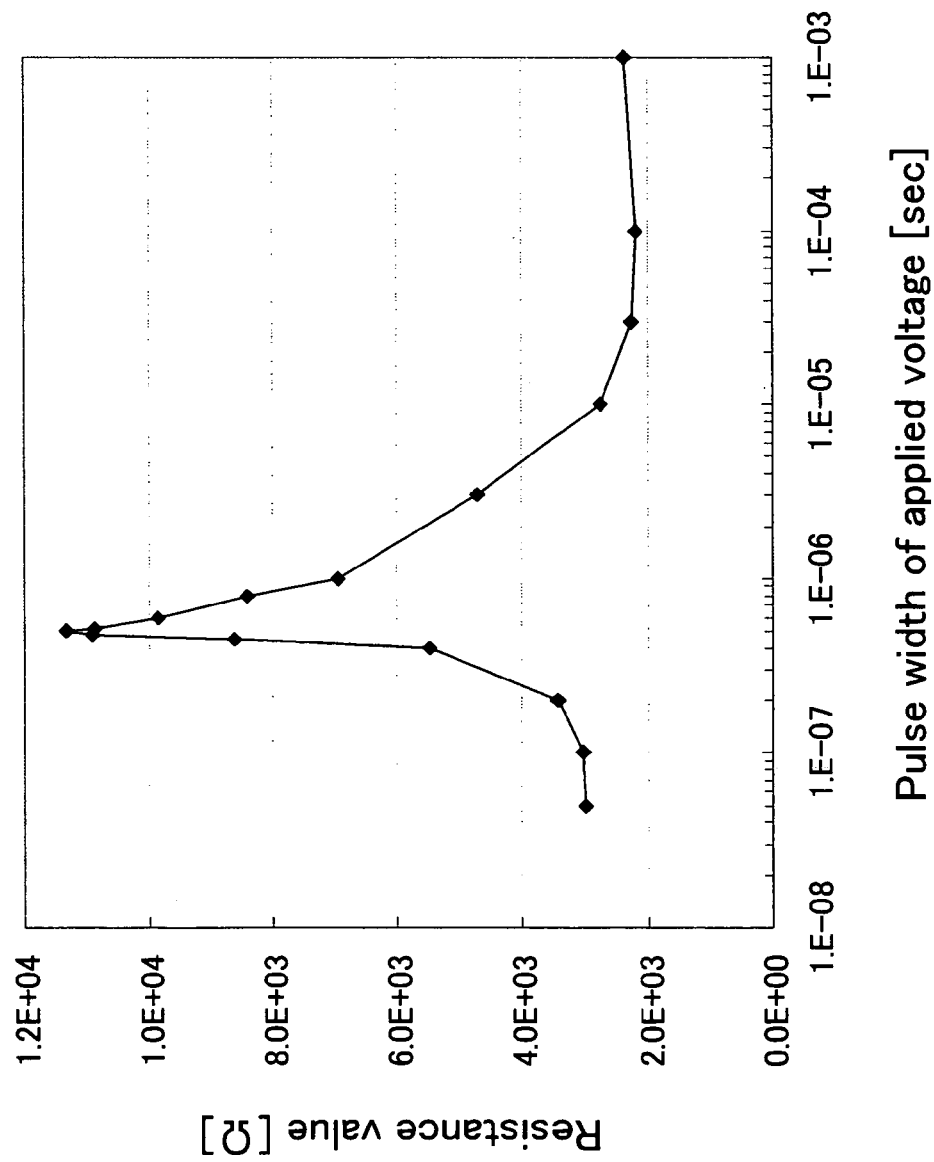
FIG. 15 is a graph showing a relation between the resistance value of the variable resistance element and the pulse width of the applied voltage.

FIG. 12 shows a potential relation between the bit line and the word line in the memory cell array at the time of reset action, in which the potentials of the selected bit line and the selected word line, and the potentials of the unselected bit lines and the unselected word lines are reversed from those in the programming action. Therefore, the voltage having a polarity opposite to that in the programming action is applied to the selected memory cell. Although the voltage having the polarity opposite to that in the programming action is applied to other unselected memory cells, the voltage is the same as $V_{BW}/3=V_1$.

As described above, when the voltage difference $V_{BW}$ is adjusted so as to satisfy the following formula 5 in the present embodiment, the memory cell can be prevented from being disturbed.

$$V_{BW}/3 < V_{TH} < V_{BW} \qquad \text{Formula 5}$$

In addition, as compared with the formula 3 in the first embodiment, the condition to prevent the disturbance of the memory cell is not so strict in the formula 5 that it can be said that the formula 5 can be easily satisfied as compared with the formula 3. Therefore, the device 1 of the present invention in the present embodiment has advantage in the case where the voltage condition restriction is strict.

Third Embodiment

Figure 17:
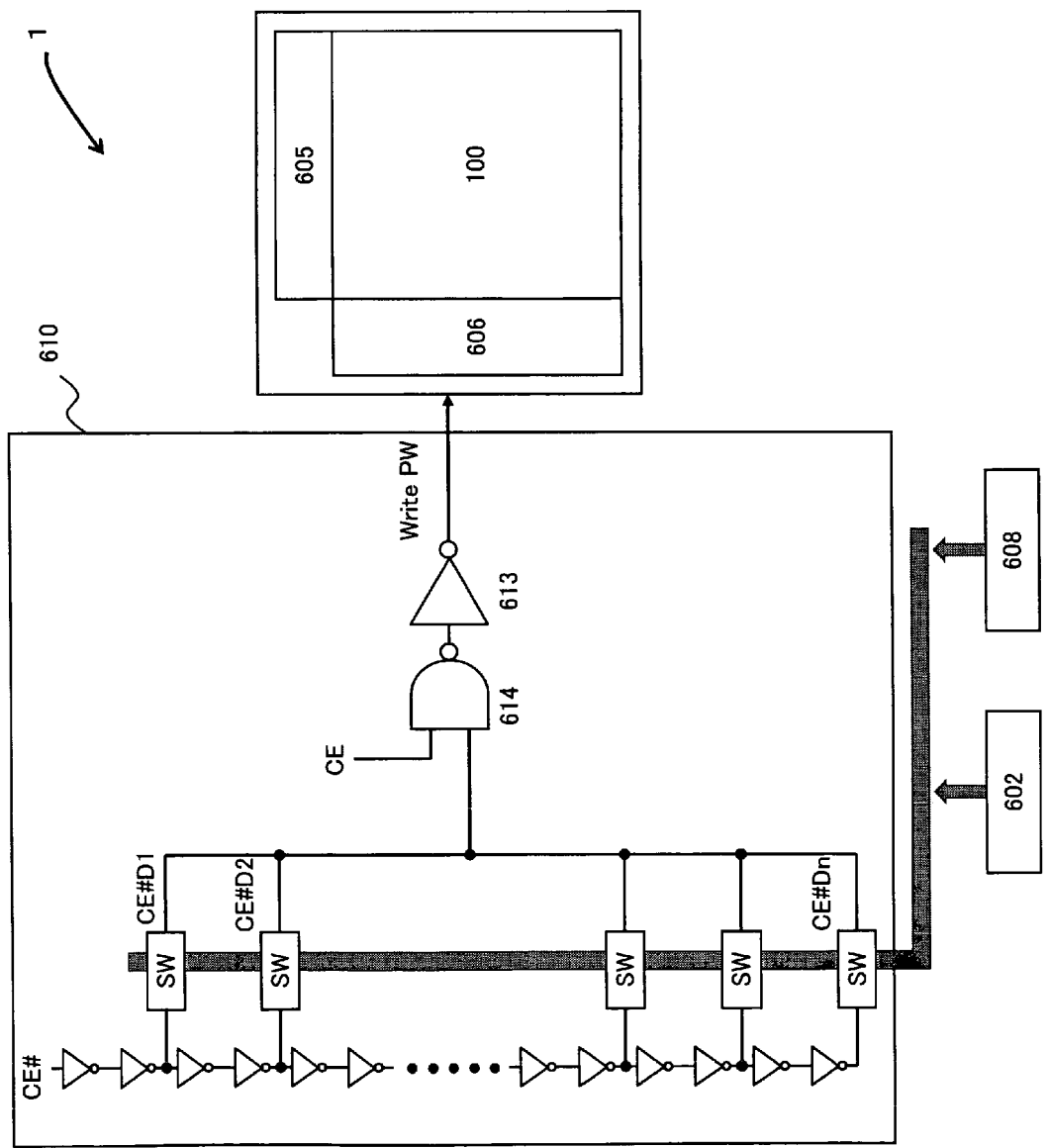
FIG. 17 is a block diagram showing a schematic constitution of a third embodiment of a semiconductor memory device according to the present invention.

A third embodiment of a device of the present invention will be described with reference to FIGS. 17 and 18. Here, FIG. 17 is a schematic block diagram showing a constitution of the device of the present invention. As shown in FIG. 17, a device 1 of the present invention includes a memory cell array 100, a pulse width adjustment circuit 610, an address decoder 602 for a writing signal, a column decoder 605, a row decoder 606, and a row address decoder 608. In addition, since the constitution of the memory cell array 100 is the same as that in the above embodiments, its description will be omitted in the present embodiment.

The pulse width adjustment circuit 610 functions to adjust the pulse width of the voltage pulse applied to an end of at least one of a selected word line and a selected bit line and includes a delay circuit including a predetermined number of inverters connected in series, switching circuits SW whose number is smaller than the number of memory cells in the memory cell array 100, an NAND circuit 614, and an inverter circuit 613. The delay circuit here includes a pair of inverter circuits. In addition, similar to the above each embodiment, the plurality of switching circuits SW are turned ON/OFF by a decode signal that selects at least one of the selected word line and the selected bit line. According to the present embodiment, the switching circuit SW selected by the signal from the address decoder 602 is turned ON. A pulse width of a voltage pulse WritePW applied to the selected memory cell is adjusted by the number of stages of the delay circuits of a switching circuit group 601.

Figure 18:
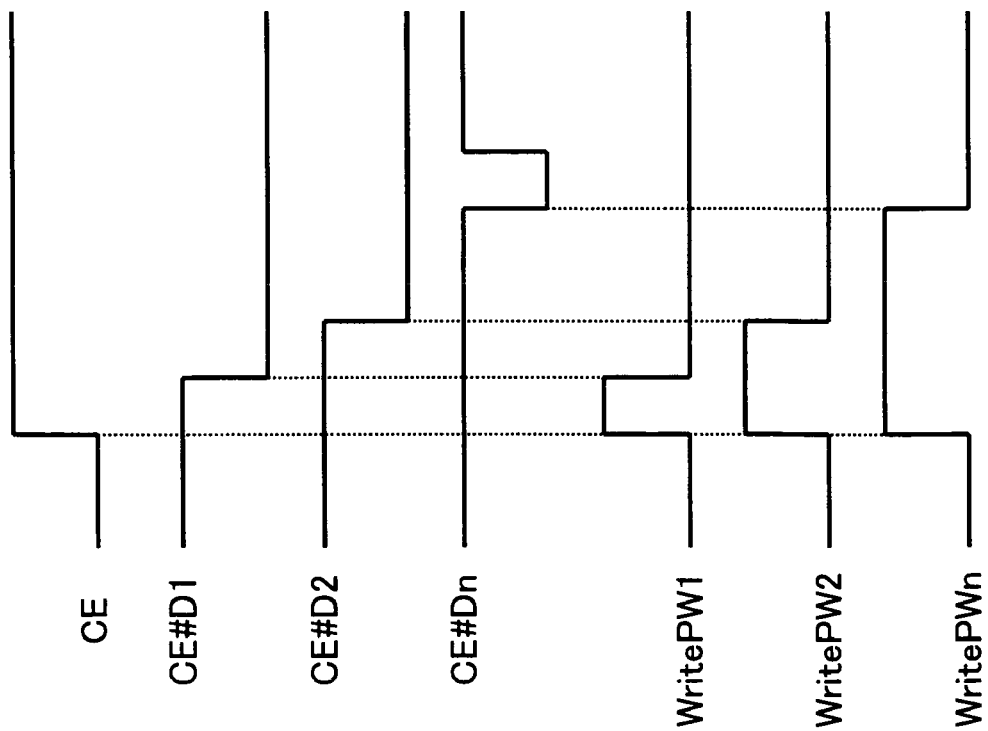
FIG. 18 is a waveform diagram of a voltage pulse generated in the third embodiment of the semiconductor memory device according to the present invention.

Here, FIG. 18 shows an input waveform and an output waveform of the switching circuit group 610 in the present embodiment. As shown in FIG. 18, the voltage pulse WritePW rises in accordance with a rise of a signal CE and falls in accordance with a fall of a signal CE#D, and the pulse width of the voltage pulse WritePW is adjusted by selecting a signal CE#D having an appropriate pulse width according to the position of the selected memory cell.

The adjustment of the pulse width of the voltage pulse in the device 1 of the present invention according to the present embodiment will be described with reference to FIGS. 3 and 4 hereinafter. According to the device 1 of the present invention, at the time of the predetermined memory action, even when an effective voltage amplitude of the voltage pulse applied to the variable resistance element 103 of the selected memory cell to be programmed or erased in the memory cells of the memory cell array 100 varies, the pulse width of the voltage pulse is adjusted according to the arranged position in the memory cell array 100 so that a resistance value after programming is within a predetermined range. The device 1 of the present invention according to the present embodiment is so constituted that the pulse width of the voltage pulse applied to an end of at least one of the selected word line connected to the selected memory cell among the word lines 102 and the selected bit line connected to the selected memory cell among the bit lines 101 is adjusted based on the arranged position of the selected memory cell in the memory cell array 100.

First, the pulse width adjustment at the time of programming action and reset action will be described with reference to FIGS. 3 and 4.

Figure 16:
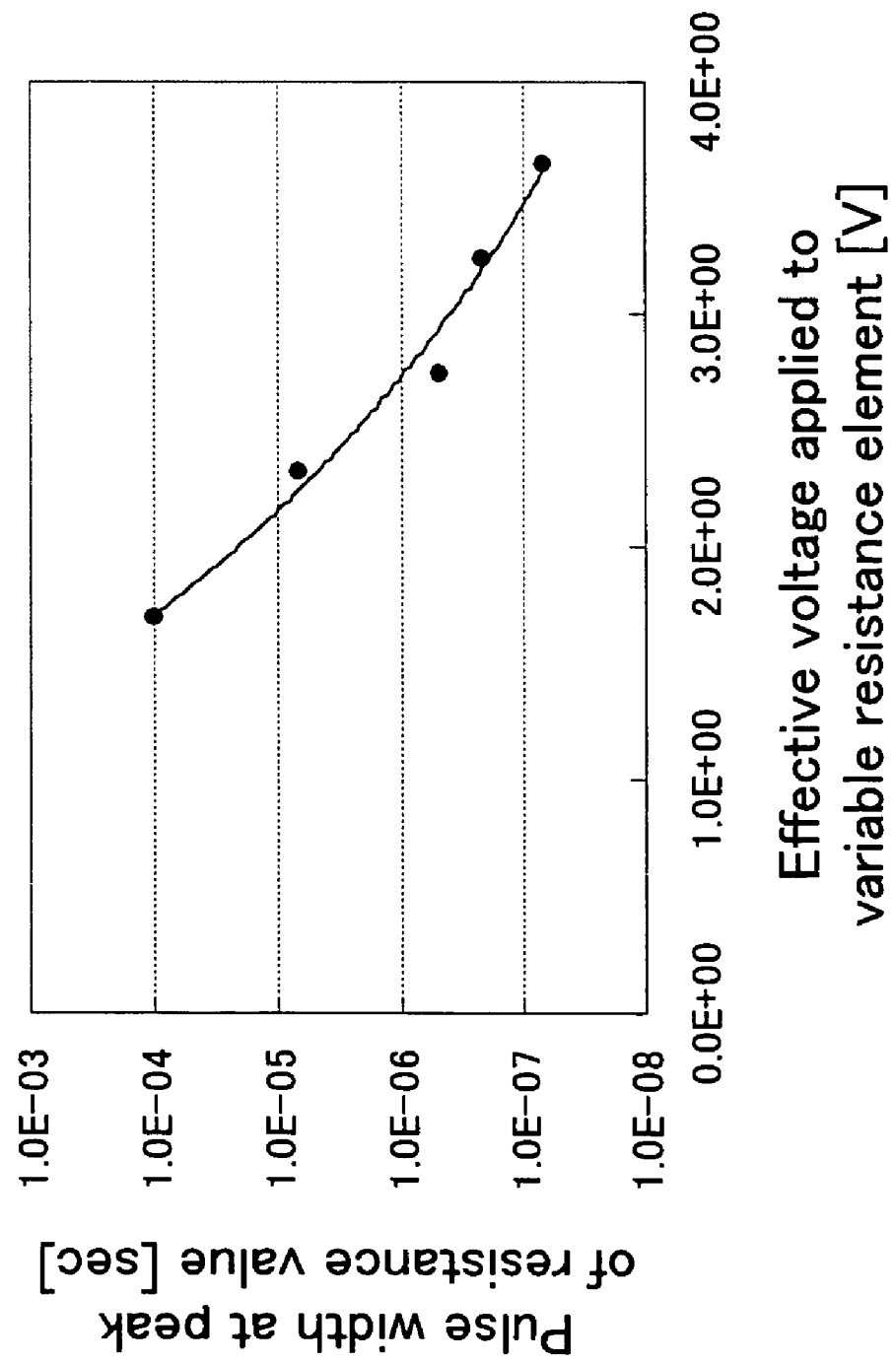
FIG. 16 is a graph showing a relation between the a pulse width of the applied voltage when the resistance value of the variable resistance element reaches a peak and an effective voltage applied to the variable resistance element.

According to the present embodiment, since a voltage difference $V_{BW}$ is a constant, an effective voltage $V_R$ applied to the memory cell actually differs depending on the place of the memory cell due to a difference in wiring length L according to the formula 1. It can be seen from FIG. 16 that the resistance value after the programming or erasing can be within a certain range by changing the programming pulse width according to the value (wiring length L) of the effective voltage $V_R$ even when the effective voltage $V_R$ applied to the variable resistance element 103 of the selected memory cell is different. That is, the pulse width is to be selected in stages in accordance with the value of the effective voltage $V_R$ based on the relation shown in FIG. 16.

Next, a description will be made of a potential relation between the bit line and the word line in the memory cell at the time of programming action according to the present embodiment with reference to FIG. 3. Here, a selected bit line 702 is selected by the voltage pulse WritePW outputted from the inverter circuit 613 through the column decoder 605 and the programming voltage $V_{BW}$ is inputted to the selected bit line 702 for a time of the pulse width of the voltage pulse WritePW. In addition, since the potential of a selected word line 703 is 0V, the potential difference of a selected memory cell 701 is the voltage difference $V_{BW}$. In addition, similar to the first embodiment, when $V_{BW} > V_{TH}$, the resistance value of the variable resistance element 103 is changed.

Furthermore, a voltage $V_{BW}/2$ is applied to unselected bit lines and unselected word lines through the column decoder 605 and the row decoder 606, and the potential difference of unselected memory cells connected to the selected bit line 702 is $V_{BW}/2 = V_1$. In addition, here, the resistance value of the variable resistance elements 103 of the unselected memory cells connected to the selected bit line 702 other than the selected memory cell 701 is not changed by adjusting the $V_1$ such that $V_1 < V_{TH}$. In addition, as for other unselected memory cells, since the potentials of the unselected bit lines and the unselected word lines are the same and an applied voltage is 0V, the resistance value of the variable resistance element 103 is not changed.

Next, a description will be made of a potential relation between the bit line and the word line in the memory cell at the time of the reset action (erasing action) according to the present embodiment with reference to FIG. 4. As shown in FIG. 4, the potentials of the bit line and the word line at the time of reset action may be such that the potential of the selected bit line 702 and the potential of the selected word line 703 may be reversed from those at the time of programming action. At this time, the voltage having a polarity opposite to that at the time of programming is applied to the selected memory cell 701 for a time of the pulse width of the voltage pulse WritePW. In addition, similar to the first embodiment, although a voltage having an opposite polarity is also applied to the unselected memory cells connected to the selected bit line 702 and the selected word line 703, similar to that at the time of programming action, when $V_1 < V_{TH}$, the resistance value of the variable resistance element 103 is not changed. As for other unselected memory cells, the potentials of the unselected bit lines and the unselected word lines are the same and as in the case of the programming action, a voltage applied to each unselected memory cell is 0V, so that the resistance value of the variable resistance element 103 is not changed.

Thus, similar to the first embodiment, when the voltage difference $V_{BW}$ is adjusted so as to satisfy the formula 3 according to FIGS. 3 and 4, the memory cell can be prevented from being disturbed.

Fourth Embodiment

A fourth embodiment of a device 1 of the present invention will be described with reference to FIGS. 19 and 20. According to the present embodiment, a description will be made of a case where the constitution regarding the programming action and reset action in the device 1 of the present invention is different from that of the third embodiment.

More specifically, although the variation in resistance value due to the difference in effective voltage at the time of programming caused by the difference in wiring length has been adjusted by the pulse width in the third embodiment, the pulse width is adjusted by varying the number of voltage pulses having a constant pulse width according to the present embodiment.

Figure 19:
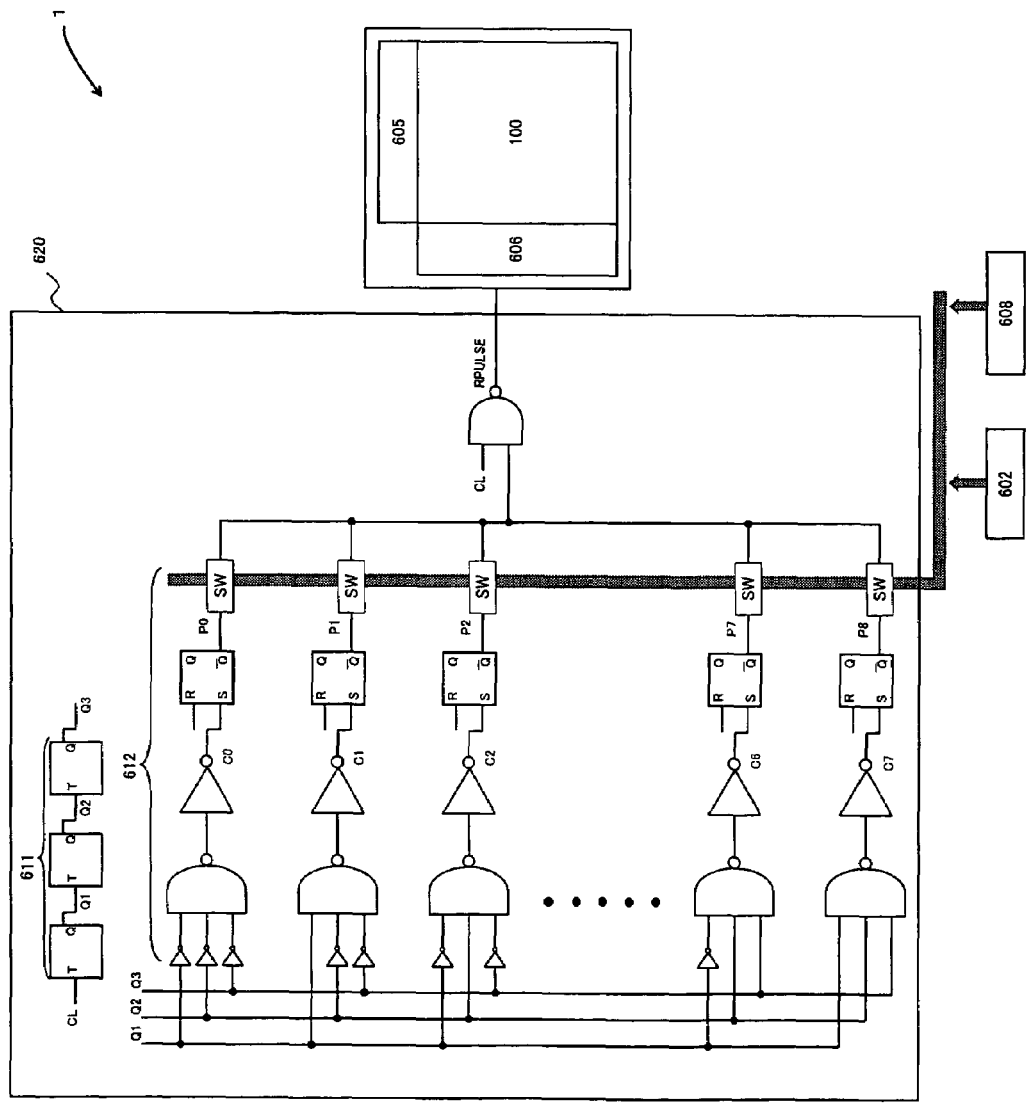
FIG. 19 is a block diagram showing a schematic constitution of a fourth embodiment of a semiconductor memory device according to the present invention.

Here, FIG. 19 is a block diagram showing a schematic constitution of a device 1 of the present invention according to the present embodiment. As shown in FIG. 19, the device 1 of the present invention includes a memory cell array 100, a pulse number adjustment circuit 620, an address decoder 602 for a writing signal, a column decoder 605, a row decoder 606, and row address decoder 608. In addition, since the constitution of the memory cell array 100 is the same as that in the above embodiments, its description will be omitted in the present embodiment.

The pulse number adjustment circuit 620 functions to adjust the pulse number of the voltage pulse applied to an end of at least one of the selected word line and the selected bit line and includes switching circuits SW whose number is smaller than the number of memory cells in the memory cell array 100, a counter circuit 611, and a pulse generation circuit 612. In addition, in FIG. 19, only seven kinds of selection circuits are shown for simplifying the description. In addition, similar to the above each embodiment, the plurality of switching circuits SW are turned ON/OFF by a decode signal that selects at least one of the selected word line and the selected bit line. According to the present embodiment, the switching circuit SW selected by a signal from the address decoder 602 is turned ON. The number of pulses of a voltage pulse RPulse applied to a selected memory cell is adjusted by the counter circuit 611 and the pulse generation circuit 612.

Figure 20:
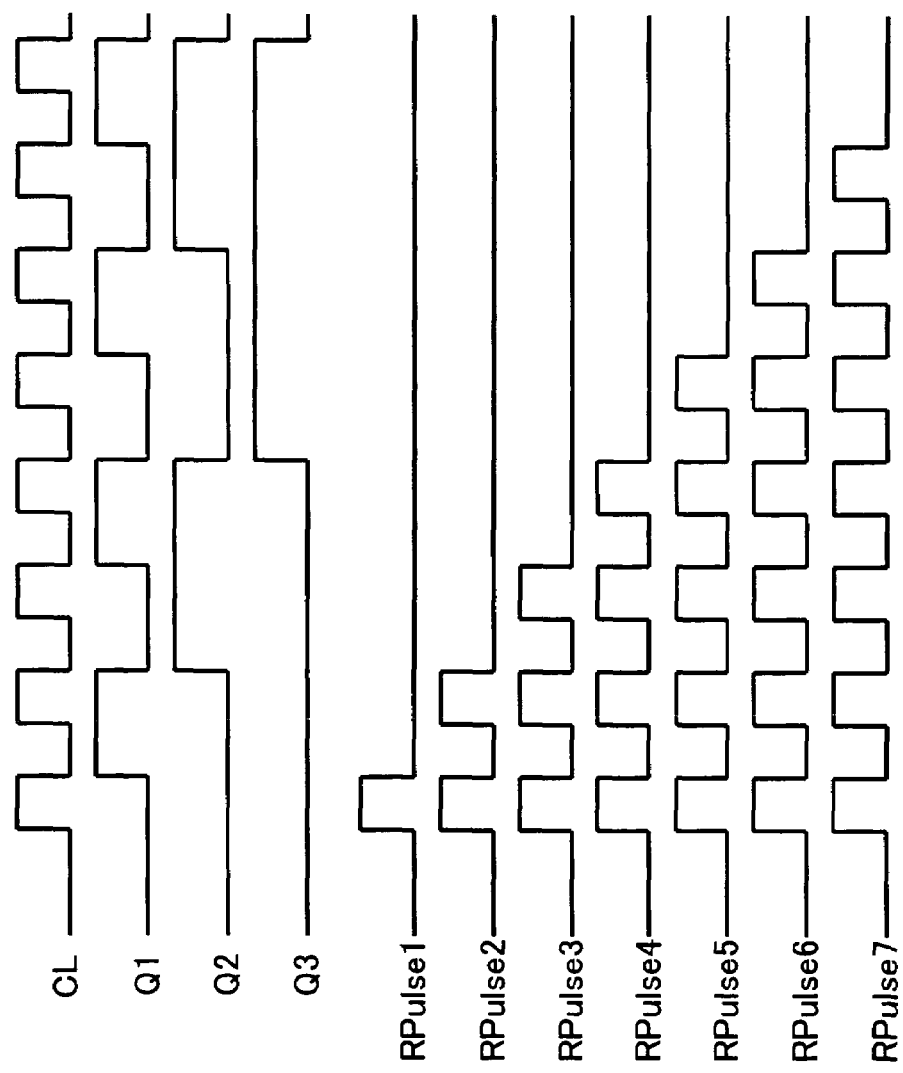
FIG. 20 is a waveform diagram of a voltage pulse generated in the fourth embodiment of the semiconductor memory device according to the present invention.

Here, FIG. 20 shows an input waveform and an output waveform of a switching circuit group 610 in the present embodiment. More specifically, a signal CL inputted to the switching circuit group 610, signals Q1 to Q3 from the counter circuit 611, and a signal RPulse outputted from the switching circuit group 610 are shown, and when a signal RPulse having an appropriate pulse number is selected according to the position of the selected memory cell, the pulse width of the voltage pulse applied to the selected memory cell is adjusted.

The adjustment of the number of the voltage pulses in the device 1 of the present invention according to the present embodiment will be described with reference to FIGS. 3 and 4 hereinafter. According to the device 1 of the present invention, at the time of the predetermined memory action, even when the effective voltage amplitude of the voltage pulse applied to the variable resistance element 103 of the selected memory cell to be programmed or erased in the memory cells of the memory cell array 100 varies, the number of pulses of the voltage pulse is adjusted according to the arranged position in the memory cell array 100 so that the resistance value after programming is within a predetermined range. The device 1 of the present invention according to the present embodiment is so constituted that the number of pulses of the voltage pulse applied to an end of at least one of the selected word line connected to the selected memory cell among the word lines 102 and the selected bit line connected to the selected memory cell among the bit lines 101 is adjusted based on the arranged position of the selected memory cell in the memory cell array 100.

According to the present embodiment, since a voltage difference $V_{BW}$ is a constant, an effective voltage $V_R$ applied to the memory cell actually differs depending on the place of the memory cell due to a difference in wiring length L according to the formula 1. It can be seen from FIG. 16 that the resistance value after the programming or erasing can be within a certain range by changing the total programming pulse width according to the value (wiring length L) of the effective voltage $V_R$ even when the effective voltage $V_R$ applied to the variable resistance element 103 of the selected memory cell is different. That is, the pulse width is to be selected in stages in accordance with the value of the effective voltage $V_R$ based on the relation shown in FIG. 16. According to the present embodiment, the pulse width is adjusted by selecting the number of pulses of the voltage pulse having a constant pulse width according to the value of the effective voltage $V_R$.

Another Embodiment (1) Although the memory cell array having the cross-point structure has been described in the above each embodiment, the present invention can be applied to a semiconductor memory device including a memory cell array having memory cells in which a selection element such as a transistor or a diode and a variable resistance element are connected in series. In this case also, since it is considered that parasitic resistance of a bit line or a source line varies depending on the position in the memory cell array, which affects the voltage applied to the variable resistance element, when the present invention is applied to it, the memory cell array has small variation in characteristics of the variable resistance element among memory cells.

(2) Although the voltage amplitude or the pulse width is adjusted according to the position of the selected memory cell in above each embodiment, both of the voltage amplitude and the pulse with may be adjusted.

The invention claimed is:

1. A semiconductor memory device comprising a memory cell array provided with memory cells each having a variable resistance element capable of storing information when its electric resistance is changed by application of a voltage pulse, the memory cells being arranged in at least one direction of a row direction and column direction, the memory cell array being provided by connecting one end of each of the memory cells in the same row to a common word line and the other end of each of the memory cells in the same column to a common bit line, wherein at least one of a voltage amplitude and a pulse width of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an electric resistance change of the variable resistance element after programming or erasing falls within a certain range regardless of the arranged position in the memory cell array according to an effective voltage amplitude or pulse width of a voltage pulse applied to the variable resistance element of the selected memory cell to be programmed or erased among the memory cells in the memory cell array.

2. A semiconductor memory device comprising a memory cell array provided with memory cells each having a variable resistance element capable of storing information when its electric resistance is changed by application of a voltage pulse, the memory cells being arranged in at least one direction of a row direction and column direction, the memory cell array being provided by connecting one end of each of the memory cells in the same row to a common word line and the other end of each of the memory cells in the same column to a common bit line, wherein a voltage amplitude of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an effective voltage amplitude of the voltage pulse applied to the variable resistance element of the selected memory cell to be programmed, erased or read among the memory cells in the memory cell array falls within a certain range regardless of the arranged position in the memory cell array.

3. The semiconductor memory device according to claim 1, wherein
at least one of a voltage applied to ends of unselected word lines not connected to the selected memory cell among the word lines and a voltage applied to unselected bit lines not connected to the selected memory cell among the bit lines is adjusted based on the arranged position of the selected memory cell in the memory cell array during a memory action.

4. The semiconductor memory device according to claim 1, wherein
when it is assumed that a voltage difference between ends of the selected word line and the selected bit line is $V_{BW}$, the effective voltage amplitude applied to the variable resistance element of the selected memory cell is $V_R$, an electric resistance value of the variable resistance element is R, and a total of wiring resistance from the ends of the selected word line and the selected bit line to the selected memory cell is $R_{LINE}$, the voltage difference $V_{BW}$ is adjusted so that the effective voltage amplitude $V_R$ given by a formula that $V_R = R/(R+R_{LINE}) \times V_{BW}$ is kept constant.

5. The semiconductor memory device according to claim 4, wherein
when it is assumed that a power supply voltage is $V_{DD}$, and a constant common to all the memory cells in the memory cell array is X, the voltage difference $V_{BW}$ is adjusted in proportion to $(R+R_{LINE})$ so as to satisfy a formula that $V_{BW} = X \times (R+R_{LINE}) \times V_{DD}$.

6. The semiconductor memory device according to claim 4 comprising a voltage adjustment circuit for adjusting a voltage amplitude of a voltage pulse applied to an end of at least one of the selected word line and the selected bit line, wherein
the voltage adjustment circuit includes a plurality of switching circuits whose number is not more than the total number of the memory cells in the memory cell array, and
the plurality of switching circuits are turned ON/OFF by a decode signal selecting at least one of the selected word line and the selected bit line.

7. The semiconductor memory device according to claim 5 comprising
a voltage adjustment circuit for adjusting a voltage amplitude of a voltage pulse applied to an end of at least one of the selected word line and the selected bit line, wherein
the voltage adjustment circuit includes an amplifier and a plurality of switching circuits whose number is not more than the total number of the memory cells in the memory cell array,
the plurality of switching circuits are turned ON/OFF by a decode signal selecting at least one of the selected word line and the selected bit line,
an output voltage V1 of the switching circuit controlled to be in an ON state is adjusted so as to satisfy a formula that $V1 = Y \times (R+R_{LINE}) \times V_{DD}$, where Y is a constant, and
the voltage difference $V_{BW}$ is provided by amplifying the output voltage V1 by the amplifier.

8. A semiconductor memory device comprising a memory cell array provided with memory cells each having a variable resistance element capable of storing information when its electric resistance is changed by application of a voltage pulse, the memory cells being arranged in at least one direction of a row direction and column direction, the memory cell array being provided by connecting one end of each of the memory cells in the same row to a common word line and the other end of each of the memory cells in the same column to a common bit line, wherein
a pulse width of a voltage pulse applied to an end of at least one of a selected word line connected to a selected memory cell among the word lines and a selected bit line connected to the selected memory cell among the bit lines is adjusted based on an arranged position of the selected memory cell in the memory cell array so that an electric resistance change of the variable resistance element after programming or erasing falls within a certain range regardless of the arranged position in the memory cell array according to an effective pulse width of a voltage pulse applied to the variable resistance element of the selected memory cell to be programmed or erased among the memory cells in the memory cell array.

9. The semiconductor memory device according to claim 8, wherein
the pulse width is adjusted by the number of voltage pulses discretely applied to an end of at least one of the selected word line and the selected bit line.

10. The semiconductor memory device according to claim 1, wherein
the memory cell array is provided with the memory cells arranged in a row direction and a column direction, and by connecting one end of the variable resistance element as one terminal of each of the memory cells in the same row to the common word line, and the other end of the variable resistance element as the other terminal of each of the memory cells in the same column to the common bit line.

11. The semiconductor memory device according to claim 2, wherein
at least one of a voltage applied to ends of unselected word lines not connected to the selected memory cell among the word lines and a voltage applied to unselected bit lines not connected to the selected memory cell among the bit lines is adjusted based on the arranged position of the selected memory cell in the memory cell array during a memory action.

12. The semiconductor memory device according to claim 2, wherein
when it is assumed that a voltage difference between ends of the selected word line and the selected bit line is VBW, the effective voltage amplitude applied to the variable resistance element of the selected memory cell is VR, an electric resistance value of the variable resistance element is R, and a total of wiring resistance from the ends of the selected word line and the selected bit line to the selected memory cell is RLINE, the voltage difference VBW is adjusted so that the effective voltage amplitude VR given by a formula that VR=R/(R+RLINE)×VBW is kept constant.

13. The semiconductor memory device according to claim 12, wherein
when it is assumed that a power supply voltage is VDD, and a constant common to all the memory cells in the memory cell array is X, the voltage difference VBW is adjusted in proportion to (R+RLINE) so as to satisfy a formula that VBW=X×(R RLINE)×VDD.

14. The semiconductor memory device according to claim 12 comprising
a voltage adjustment circuit for adjusting a voltage amplitude of a voltage pulse applied to an end of at least one of the selected word line and the selected bit line, wherein the voltage adjustment circuit includes a plurality of switching circuits whose number is not more than the total number of the memory cells in the memory cell array, and the plurality of switching circuits are turned ON/OFF by a decode signal selecting at least one of the selected word line and the selected bit line.

15. The semiconductor memory device according to claim 13 comprising a voltage adjustment circuit for adjusting a voltage amplitude of a voltage pulse applied to an end of at least one of the selected word line and the selected bit line, wherein the voltage adjustment circuit includes an amplifier and a plurality of switching circuits whose number is not more than the total number of the memory cells in the memory cell array, the plurality of switching circuits are turned ON/OFF by a decode signal selecting at least one of the selected word line and the selected bit line, an output voltage V1 of the switching circuit controlled to be in an ON state is adjusted so as to satisfy a formula that V1=Y×R+RLINE)×VDD, where Y is a constant, and the voltage difference VBW is provided by amplifying the output voltage V1 by the amplifier.

16. The semiconductor memory device according to claim 2, wherein the memory cell array is provided with the memory cells arranged in a row direction and a column direction, and by connecting one end of the variable resistance element as one terminal of each of the memory cells in the same row to the common word line, and the other end of the variable resistance element as the other terminal of each of the memory cells in the same column to the common bit line.

17. The semiconductor memory device according to claim 8, wherein the memory cell array is provided with the memory cells arranged in a row direction and a column direction, and by connecting one end of the variable resistance element as one terminal of each of the memory cells in the same row to the common word line, and the other end of the variable resistance element as the other terminal of each of the memory cells in the same column to the common bit line.

* * * * *

UNITED STATES PATENT AND TRADEMARK OFFICE
CERTIFICATE OF CORRECTION

PATENT NO. : 7,668,001 B2  Page 1 of 1
APPLICATION NO. : 11/921755
DATED : February 23, 2010
INVENTOR(S) : Tajiri et al.

It is certified that error appears in the above-identified patent and that said Letters Patent is hereby corrected as shown below:

Page 1, Item (22) change "January 5, 2006" to --May 1, 2006--.

Signed and Sealed this

Eighteenth Day of May, 2010

David J. Kappos
*Director of the United States Patent and Trademark Office*